(12) United States Patent
Park et al.

(10) Patent No.: US 12,010,832 B2
(45) Date of Patent: Jun. 11, 2024

(54) SEMICONDUCTOR MEMORY DEVICE

(71) Applicant: Samsung Electronics Co., Ltd., Suwon-si (KR)

(72) Inventors: Jae Hong Park, Hwaseong-si (KR); Jae-Wha Park, Yongin-si (KR); Moon Keun Kim, Hwaseong-si (KR); Jung Ha Hwang, Gunpo-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 131 days.

(21) Appl. No.: 17/461,051

(22) Filed: Aug. 30, 2021

(65) Prior Publication Data

US 2022/0102358 A1 Mar. 31, 2022

(30) Foreign Application Priority Data

Sep. 25, 2020 (KR) .................. 10-2020-0124385

(51) Int. Cl.
*H10B 12/00* (2023.01)
*G11C 5/06* (2006.01)

(52) U.S. Cl.
CPC ............ *H10B 12/50* (2023.02); *H10B 12/33* (2023.02); *G11C 5/063* (2013.01)

(58) Field of Classification Search
CPC ........ H10B 12/50; H10B 12/33; H10B 12/03; H10B 12/05; H10B 12/488; H10B 12/30; H10B 61/22; H10B 63/30; H10B 63/84; H10B 12/482; H10B 12/0335; G11C 5/063
See application file for complete search history.

(56) References Cited

U.S. PATENT DOCUMENTS

| | | | |
|---|---|---|---|
| 7,052,983 B2 | 5/2006 | Park et al. | |
| 9,245,588 B2 | 1/2016 | Park | |
| 9,837,155 B1 | 12/2017 | Kim et al. | |
| 10,468,414 B2 | 11/2019 | Kim et al. | |
| 10,535,659 B2 | 1/2020 | Kim et al. | |
| 2019/0006376 A1 | 1/2019 | Ramaswamy | |
| 2019/0164985 A1 | 5/2019 | Lee et al. | |
| 2020/0279601 A1* | 9/2020 | Kim | G11C 7/18 |
| 2021/0257366 A1* | 8/2021 | Lee | H10B 12/50 |
| 2022/0005809 A1* | 1/2022 | Kim | H01L 27/124 |
| 2022/0122976 A1* | 4/2022 | Kim | H10B 12/30 |
| 2022/0122977 A1* | 4/2022 | Kim | H10B 12/30 |
| 2022/0157819 A1* | 5/2022 | Jung | H10B 12/488 |
| 2022/0208766 A1* | 6/2022 | Kim | H10B 12/30 |
| 2022/0246619 A1* | 8/2022 | Kim | H01L 29/78618 |

* cited by examiner

*Primary Examiner* — Edward Chin
(74) *Attorney, Agent, or Firm* — Harness, Dickey & Pierce, P.L.C.

(57) ABSTRACT

A semiconductor memory device may include at least one semiconductor pattern including a horizontal portion extending in a second direction parallel to a top surface of a semiconductor substrate and a vertical portion extending in the first direction, at least one gate electrode on the horizontal portion of the at least one semiconductor pattern and extending in a third direction different from the first direction and the second direction, and at least one information storage element connected to the vertical portion of the at least one semiconductor pattern, wherein a thickness of the horizontal portion of the at least one semiconductor pattern in the first direction is smaller than a thickness of the vertical portion of the at least one semiconductor pattern in the first direction.

20 Claims, 22 Drawing Sheets

SEMICONDUCTOR MEMORY DEVICE

CROSS-REFERENCE TO RELATED APPLICATION

This U.S. non-provisional application claims the benefit of priority under 35 U.S.C. 119 from Korean Patent Application No. 10-2020-0124385, filed on Sep. 25, 2020 in the Korean Intellectual Property Office, the entire contents of which are incorporated by reference herein.

BACKGROUND

Various example embodiments of the inventive concepts relate to a semiconductor memory devices and/or methods of operating the semiconductor memory device, and more particularly, to a three-dimensional (3D) semiconductor memory device with improved electrical characteristics and/or a method of operating the 3D semiconductor memory device.

In order to satisfy consumer demands for superior performance and inexpensive prices, it is desired to increase the integration density of semiconductor devices. In a semiconductor device, since the integration density thereof is an important factor in determining the price of a product, an increased integration density is particularly desired and/or required.

In the case of conventional two-dimensional (2D) or planar semiconductor devices, since their integration density is mainly determined by the area occupied by a unit memory cell, it is greatly influenced by the level of fine pattern forming technology. However, since extremely high-priced equipment is required for the miniaturization of patterns, the integration density of the two-dimensional semiconductor devices has been increased but is still limited. Accordingly, 3D semiconductor memory devices having memory cells arranged three-dimensionally have been proposed.

SUMMARY

Aspects of at least one example embodiment of the inventive concepts provide for a 3D semiconductor memory device with improved electrical characteristics and/or reliability.

According to at least one example embodiment of the inventive concepts, there is provided a semiconductor memory device comprising at least one bit line on a semiconductor substrate, the bit line extending in a first direction perpendicular to a top surface of the semiconductor substrate, at least one semiconductor pattern including a horizontal portion extending in a second direction parallel to the top surface of the semiconductor substrate and a vertical portion extending in the first direction, a first end of the horizontal portion of the at least one semiconductor pattern being connected to the at least one bit line, and a second end of the horizontal portion of the at least one semiconductor pattern being connected to the vertical portion of the at least one semiconductor pattern, at least one gate electrode on the horizontal portion of the at least one semiconductor pattern and extending in a third direction different from the first direction and the second direction, and at least one information storage element connected to the vertical portion of the at least one semiconductor pattern, wherein a thickness of the horizontal portion of the at least one semiconductor pattern in the first direction is smaller than a thickness of the vertical portion of the at least one semiconductor pattern in the first direction.

According to some example embodiments, there is provided a semiconductor memory device comprising at least one bit line on a semiconductor substrate, the at least one bit line extending in a first direction perpendicular to a top surface of the semiconductor substrate, at least one gate electrode including an upper gate electrode and a lower gate electrode extending in a second direction parallel to the top surface of the semiconductor substrate, the upper gate electrode being spaced apart from the lower gate electrode in the first direction, at least one semiconductor pattern between the lower gate electrode and the upper gate electrode and extending in a third direction different from the first direction and the second direction, a portion of the at least one semiconductor pattern overlapping the upper gate electrode and the lower gate electrode in the third direction, and at least one information storage element connected to the at least one semiconductor pattern.

According to some example embodiments, there is provided a semiconductor memory device comprising a plurality of mold insulating layers on a semiconductor substrate which are spaced apart from each other in a first direction perpendicular to a top surface of the semiconductor substrate, a plurality of semiconductor patterns between the plurality of mold insulating layers, the plurality of semiconductor patterns adjacent to each other in the first direction, a plurality of gate electrodes on each of the plurality of semiconductor patterns, the plurality of gate electrodes between the plurality of mold insulating layers, the plurality of gate electrodes adjacent to each other in the first direction and extending in a second direction perpendicular to the first direction, each of the gate electrodes including an upper gate electrode and a lower gate electrode spaced apart in the first direction, a bit line on the semiconductor substrate, the bit line extending in the first direction and being connected to the plurality of semiconductor patterns, and a capacitor structure connected to the plurality of semiconductor patterns, wherein each of the semiconductor patterns includes a horizontal portion extending in a third direction different from the first direction and the second direction, and a vertical portion extending in the first direction, a first end of the horizontal portion of each of the semiconductor patterns is connected to the bit line, and a second end of the horizontal portion of each of the semiconductor patterns is connected to the vertical portion of the semiconductor pattern, and a thickness of the horizontal portion of each of the semiconductor patterns in the first direction is smaller than a thickness of the vertical portion of each of the semiconductor patterns in the first direction.

However, aspects of one or more of the example embodiments are not restricted to the ones set forth herein. The above and other aspects of the various example embodiments of the inventive concepts will become more apparent to one of ordinary skill in the art by referencing the detailed description given below.

BRIEF DESCRIPTION OF THE DRAWINGS

The above and other aspects and features of the inventive concepts will become more apparent by describing in detail various example embodiments thereof with reference to the attached drawings, in which.

DETAILED DESCRIPTION

Figure 1:
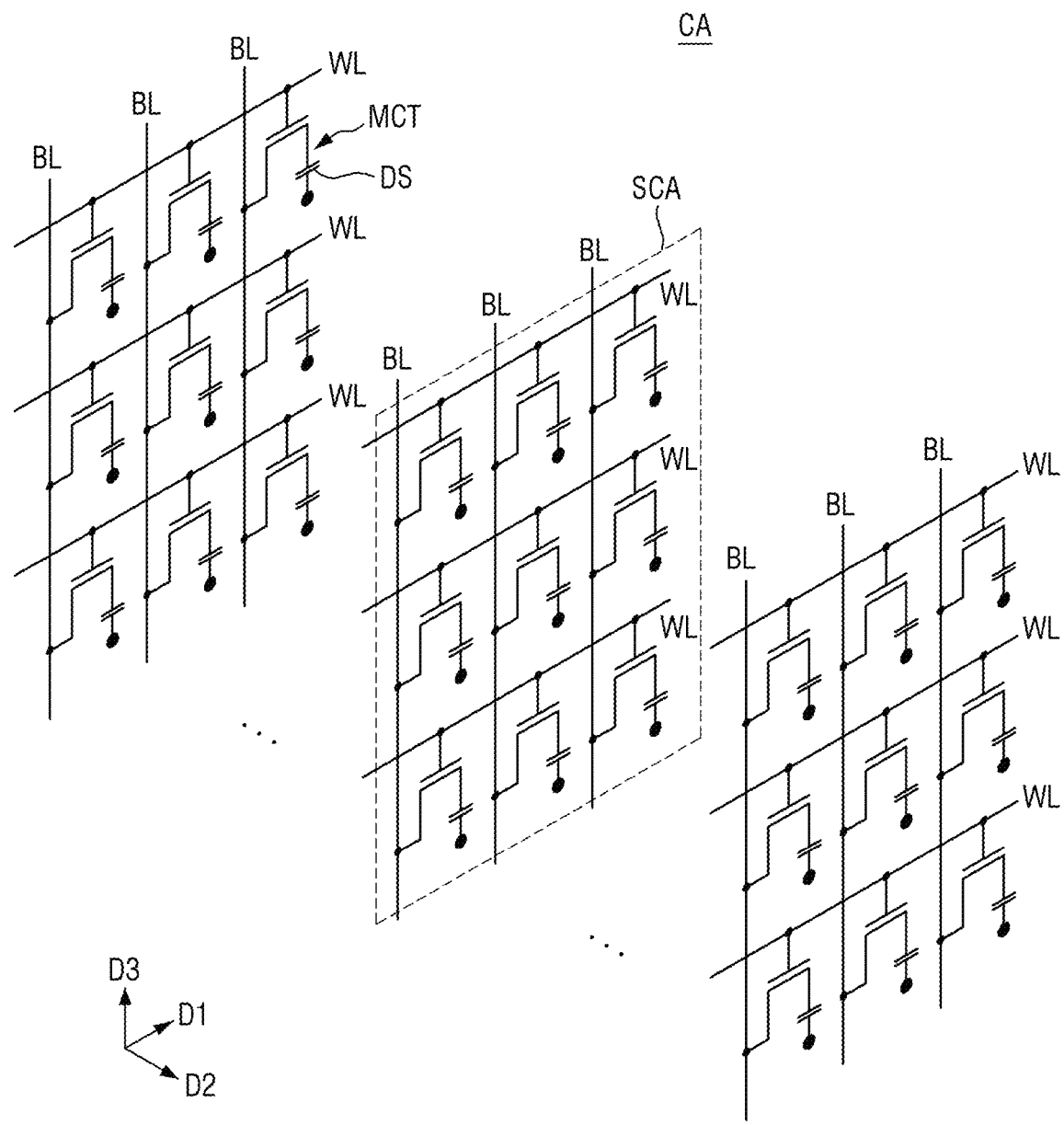
FIG. 1 is a simplified circuit view showing a cell array of a three-dimensional (3D) semiconductor memory device according to at least one example embodiment.

FIG. 1 is a simplified circuit view showing a cell array of a three-dimensional (3D) semiconductor memory device according to at least one example embodiment.

Referring to FIG. 1, a cell array CA of a 3D semiconductor memory device according to at least one example embodiment may include a plurality of sub-cell arrays SCA, but the example embodiments are not limited thereto. The sub-cell arrays SCA may be arranged along a second direction D2 of the cell array CA, but are not limited thereto. According to some example embodiments, the 3D semiconductor memory device may include a plurality of cell arrays CA, but the example embodiments are not limited thereto.

Each of the sub-cell arrays SCA may include a plurality of bit lines BL, a plurality of word lines WL, and/or a plurality of memory cell transistors MCT, etc. One memory cell transistor MCT may be included (e.g., arranged, connected, disposed, etc.) between one word line WL and one bit line BL.

The bit lines BL may be conductive patterns (e.g., metallic conductive lines) extending in a direction (i.e., a third direction D3) perpendicular to the substrate (e.g., the semiconductor substrate). The bit lines BL in one sub-cell array SCA may be arranged in, e.g., a first direction D1, but are not limited thereto. The bit lines BL adjacent to each other may be spaced apart in the same direction, e.g., the first direction D1, but are not limited thereto.

The word lines WL may be conductive patterns (e.g., metallic conductive lines) stacked on the substrate in, e.g., the third direction D3, or in other words, the word lines WL may be located along a direction perpendicular to the direction of the bit lines, etc. Each of the word lines WL may extend in, e.g., the first direction D1, but are not limited thereto. The word lines BL adjacent to each other may be spaced apart in the third direction D3, etc.

The gate of the memory cell transistor MCT may be connected to the word line WL, and the first source/drain of the memory cell transistor MCT may be connected to the bit line BL. The second source/drain of the memory cell transistor MCT may be connected to an information storage element DS. For example, the information storage element DS may be a capacitor, etc. Additionally, the second source/drain of the memory cell transistor MCT may be connected to the lower electrode of the capacitor, etc.

FIGS. 2 to 7 are example perspective views each illustrating a semiconductor memory device according to some example embodiments.

Figure 2:
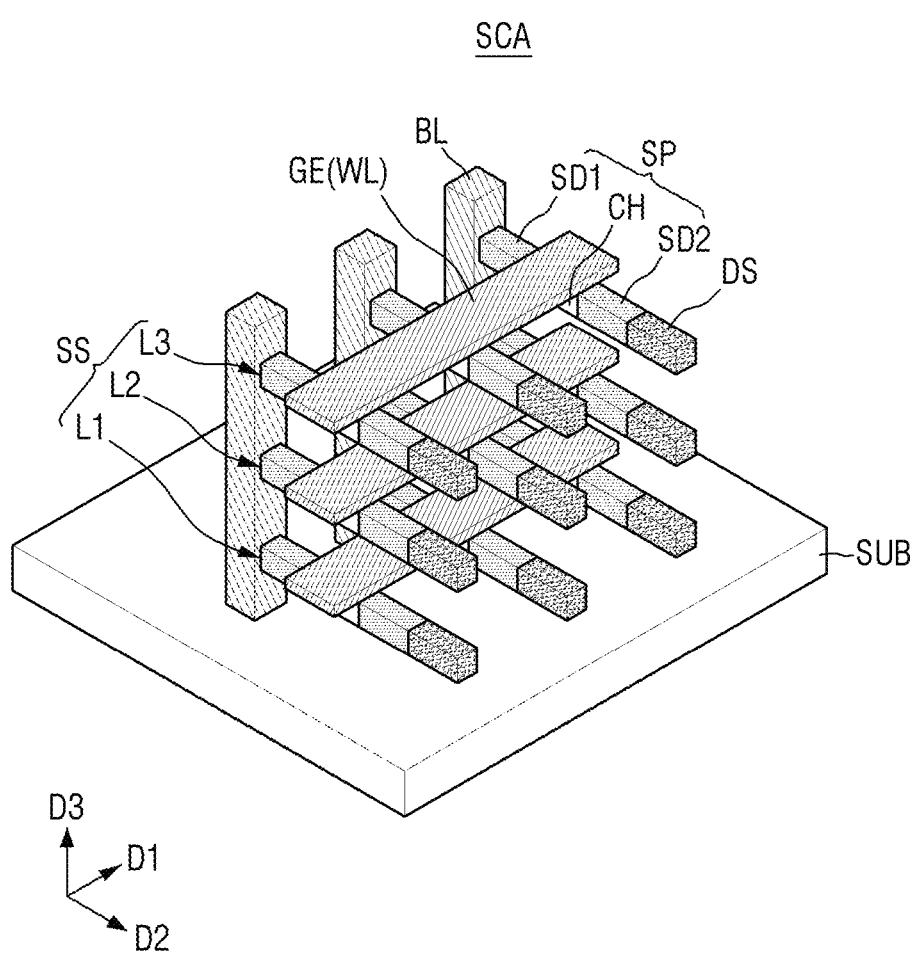
FIGS. 2 to 7 are example perspective views each illustrating a semiconductor memory device according to some example embodiments.

Referring to FIGS. 1 and 2, one of the plurality of sub-cell arrays SCA described with reference to FIG. 1 may be located on a semiconductor substrate SUB.

The substrate SUB may be a bulk silicon or silicon-on-insulator (all) substrate, but the example embodiments are not limited thereto. Additionally, the semiconductor substrate SUB may be a silicon substrate, or may include other materials such as silicon germanium, silicon germanium on insulator (SGOI), indium antimonide, a lead tellurium compound, indium arsenide, indium phosphide, gallium arsenide, or gallium antimonide, but is not limited thereto. In the following descriptions of the example embodiments, the substrate SUB will be described as being a substrate containing silicon for the sake of brevity, but the example embodiments are not limited thereto.

According to at least one example embodiment, a plurality of layers, such as first to third layers L1, L2, and L3, etc., of a stacked structure SS may be located (e.g., included, arranged, disposed, etc.) on the substrate SUB, but the example embodiments are not limited thereto. The plurality of layers, e.g., first to third layers L1, L2, and L3, of the stacked structure SS may be stacked such that they are spaced apart from each other in a direction (i.e., the third direction D3, etc.) perpendicular to the top surface of the substrate SUB. Additionally, the plurality of layers, e.g., first to third layers L1, L2, and L3, of the stacked structure SS may be stacked apart from each other in the thickness direction SUB (e.g., the third direction D3) of the substrate, but the example embodiments are not limited thereto.

Each of the plurality of layers, e.g., layers L1, L2, and L3, etc., may include a plurality of semiconductor patterns SP, a plurality of information storage elements DS, and/or a gate electrode GE, etc., but are not limited thereto.

According to some example embodiments, the semiconductor pattern SP may have a line shape, a rectangular shape, or a bar shape extending in the second direction D2, but are not limited thereto, and the semiconductor pattern SP may have other shapes. The semiconductor pattern SP may include a semiconductor material such as silicon, germanium, and/or silicon-germanium, but is not limited thereto. For example, the semiconductor pattern SP may include at least one of polysilicon, polysilicon germanium, monocrystalline silicon, and/or monocrystalline silicon-germanium, etc.

Each semiconductor pattern SP may include a channel region CH, a first impurity region SD1, and/or a second impurity region SD2, etc. The channel region CH may be interposed between the first and second impurity regions SD1 and SD2. The channel region CH may correspond to a channel of the memory cell transistor MCT described with reference to FIG. 1, etc. The first and second impurity regions SD1 and SD2 may correspond to the first source/drain and the second source/drain of the memory cell transistor MCT described with reference to FIG. 1, respectively, but are not limited thereto.

The first and second impurity regions SD1 and SD2 may be regions of the semiconductor pattern SP doped with impurities. Accordingly, the first and second impurity regions SD1 and SD2 may have an n-type or p-type conductivity type. The first impurity region SD1 may be formed adjacent to the first end of the semiconductor pattern SP, and the second impurity region SD2 may be formed adjacent to the second end of the semiconductor pattern SP. The second end may face the first end in the second direction D2, but the example embodiments are not limited thereto.

The first impurity region SD1 may be formed adjacent to the bit line BL, but is not limited thereto. Additionally, the first impurity region SD1 may be connected to the bit line BL. The second impurity region SD2 may be formed adjacent to the information storage element DS, but is not limited thereto. Additionally, the second impurity region SD2 may be connected to the information storage element DS.

The information storage elements DS may be memory elements capable of storing data (e.g., one or more bits of data). Each information storage element DS may be a memory element using a capacitor, a memory element using a magnetic tunnel junction pattern, and/or a memory element using a variable resistor including a phase change material, but is not limited thereto. For example, each information storage element DS may be a capacitor, etc.

The gate electrode GE may have a line shape, a rectangular shape, and/or a bar shape extending in the first direction D1, but the example embodiments are not limited thereto, and the gate electrode GE may have other shapes. The gate electrodes GE may be stacked spaced apart from each other along a same direction, such as the third direction D3, etc. Each gate electrode GE may cross the semiconductor pattern SP in one layer and extend in, e.g., the first direction D1, but is not limited thereto. In other words, the gate electrode GE may be the horizontal word lines WL described with reference to FIG. 1, but the example embodiments are not limited thereto.

The gate electrode GE may include a conductive material. For example, the gate electrode GE may include at least one of a doped semiconductor material (doped silicon, doped silicon-germanium, doped germanium, etc.), conductive metal nitride (titanium nitride, tantalum nitride, etc.), metal (tungsten, titanium, tantalum, etc.), and/or a metal-semiconductor compound (tungsten silicide, cobalt silicide, titanium silicide, etc.), but is not limited thereto.

The plurality of bit lines BL extending in a vertical direction (e.g., the third direction D3) may be provided on the semiconductor substrate SUB. Each bit line BL may have a line shape, a rectangular shape, and/or a column shape extending in the third direction D3, but is not limited thereto, and for example, may have any other shape. For example, the bit line BL may be arranged along the first direction D1, but is not limited thereto. Each bit line BL may be electrically connected to the first impurity region SD1 of the vertically stacked semiconductor patterns SP, but is not limited thereto.

According to some example embodiments, each bit line BL may include a conductive material, and may include, for example, at least one of a doped semiconductor material, conductive metal nitride, metal and/or metal-semiconductor compound, but are not limited thereto. The bit lines BL may be the vertical bit lines BL described with reference to FIG. 14, but are not limited thereto.

The representative first layer L1 among the plurality of layers L1, L2, and L3 will be described in detail, and may be representative of the other layers of the plurality of layers, but the example embodiments are not limited thereto. According to at least one example embodiment, the semiconductor patterns SP of the first layer L1 may be arranged in the first direction D1, but are not limited thereto. The semiconductor patterns SP of the first layer L1 may be positioned at the same level, but are not limited thereto. The gate electrode GE of the first layer L1 may cross the semiconductor pattern SP of the first layer L1 and extend in the first direction D1. For example, the gate electrode GE of the first layer L1 may be provided (e.g., included, located, disposed, etc.) on the top surface of the semiconductor pattern SP.

Although not illustrated, a gate insulating layer may be interposed between the gate electrode GE and the channel region CH. The gate insulating layer may include at least one of a high-k insulating layer, a silicon oxide layer, a silicon nitride layer, and/or a silicon oxynitride layer, etc., but is not limited thereto. For example, the high-k insulating layer may contain at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate, etc.

Each bit line BL may be connected to a first end of the semiconductor pattern SP of the first layer L1. For example, each of the bit lines BL may be directly connected to the first impurity regions SD1, but are not limited thereto. As another example, the bit lines BL may be electrically connected to the first impurity region SD1 through metal silicide, etc. A detailed description of the second layer L2 and the third layer L3 may be the same or substantially the same as the first layer L1 described above, but are not limited thereto.

Although not illustrated, empty spaces in the stacked structure SS may be filled with an insulating material. For example, the insulating material may include at least one of a silicon oxide layer, a silicon nitride layer, and/or a silicon oxynitride layer, but is not limited thereto. A wire layer electrically connected to the sub-cell array SCA may also be arranged (e.g., included, located, disposed, etc.) on the stacked structure SS.

Although not illustrated, a peripheral circuit for operating the sub-cell array SCA may be formed on the semiconductor substrate SUB. Using the wire layer, the peripheral circuit and the sub-cell array may be connected, etc.

According to at least one example embodiment, the first direction D1, the second direction D2, and the third direction D3 may be perpendicular to each other, but are not limited thereto. In addition, the first direction D1 and the second direction D2 may be parallel to the top surface of the substrate SUB, and the third direction D3 may be perpendicular to the top surface of the substrate SUB, but are not limited thereto.

Hereinafter, in the at least one example embodiment of FIGS. 3 to 7, detailed descriptions of technical features overlapping those described with reference to FIGS. 1 and 2 will be omitted for the sake of clarity and brevity, and the aspects of the example embodiments of FIGS. 3 to 7 which differ from FIGS. 1 and 2 will be described in detail.

Figure 3:
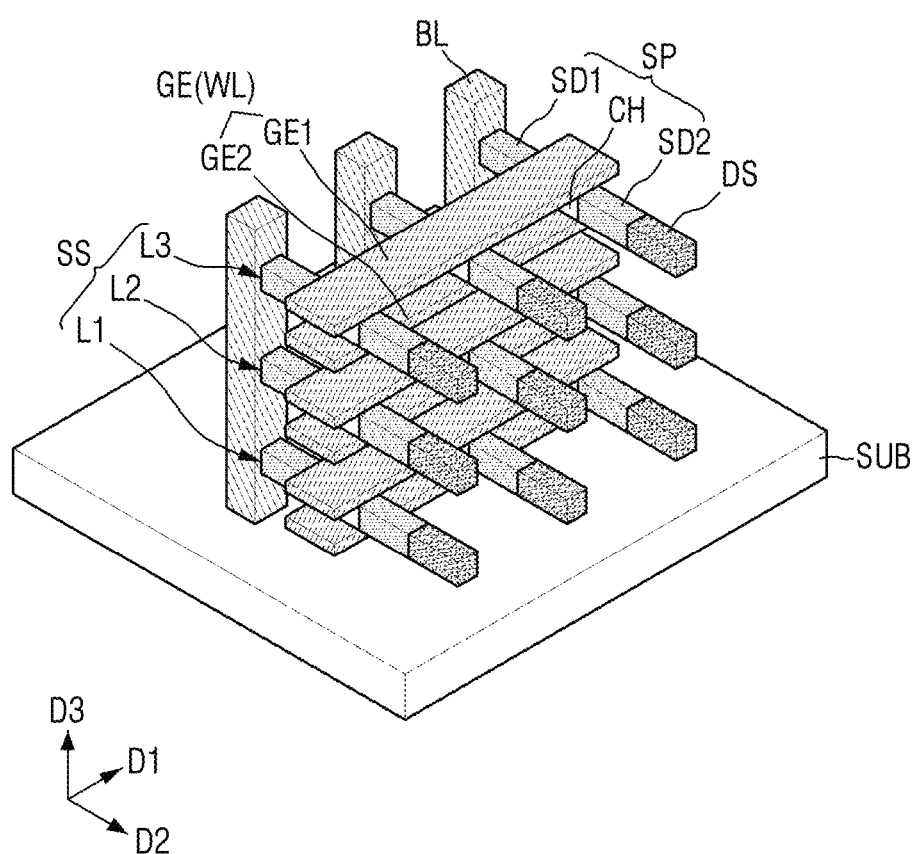

Referring to FIGS. 1 and 3, the gate electrode GE associated with and/or corresponding to each layer of the semiconductor device (e.g., layers L1 to L3, etc.) may include a first gate electrode GE1 on the top surface of the semiconductor pattern SP and a second gate electrode GE2 on the bottom surface of the semiconductor pattern SP associated with and/or corresponding to the respective layer, but is not limited thereto.

In other words, in the semiconductor device according to some example embodiments, the memory cell transistor may be a double gate transistor in which the gate electrode GE is provided on both surfaces (e.g., the top and bottom surfaces, the first and second surfaces, etc.) of the channel region CH of the transistor, but the example embodiments are not limited thereto.

Figure 4:
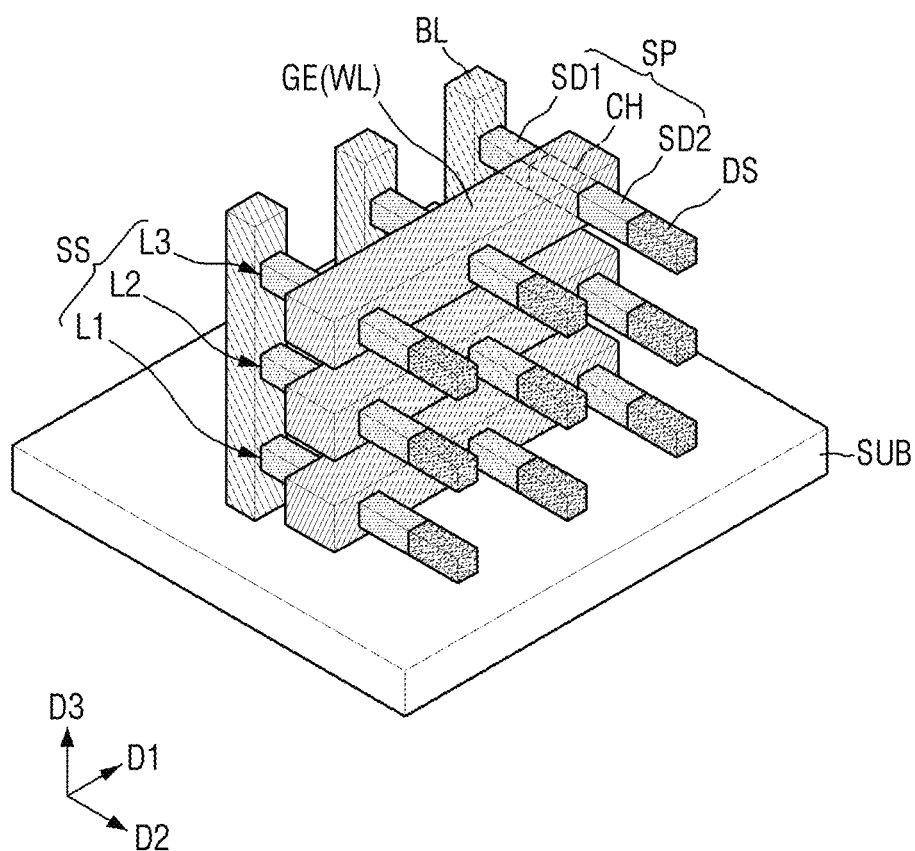

Referring to FIGS. 1 and 4, the gate electrode GE associated with and/or corresponding to each layer of the semiconductor device (e.g., layers L1 to L3, etc.) may surround the channel region CH of the semiconductor pattern SP of the respective layer. The gate electrode GE may be provided on the top surface, the bottom surface, and both sidewalls of the channel region CH of the respective layer, but the example embodiments are not limited thereto.

In other words, in the semiconductor device according to some example embodiments, the memory cell transistor may be a gate-all-around transistor in which the gate electrode GE surrounds the channel region CH, but is not limited thereto.

In other words, the gate electrode GE may include the first gate electrode GE1 and the second gate electrode GE2 described with reference to FIG. 3, and a connection gate electrode connecting the first gate electrode GE1 to the second gate electrode GE2. The connection gate electrode may be between the semiconductor patterns SP that are spaced apart in the first direction D1 at the same level, but the example embodiments are not limited thereto.

Figure 5:
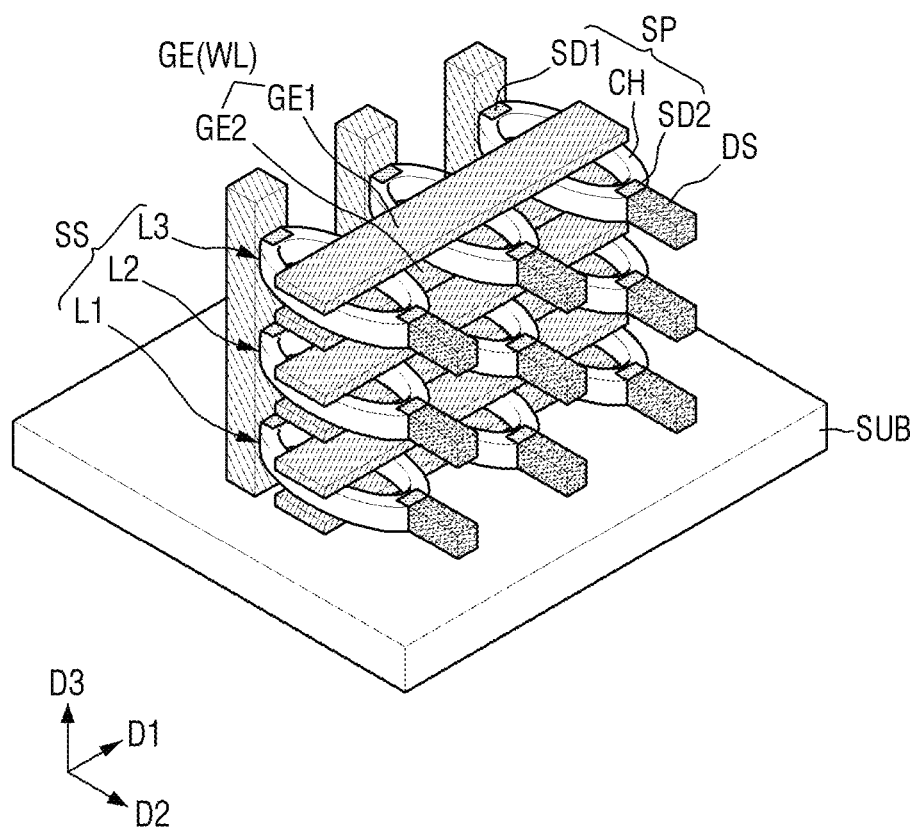

Referring to FIGS. 1 and 5, in plan view, according to at least one example embodiment, the semiconductor pattern SP may have a closed-loop shape.

For example, the semiconductor pattern SP may have an annular shape, an oval shape, a circular shape, etc., but is not limited thereto. Additionally, according to some example embodiments, the semiconductor pattern SP may have a loop shape having a quadrangular shape and/or polygonal shape, etc., in which an outer peripheral surface is chamfered, etc.

In addition, each of the gate electrodes GE may include a first gate electrode GE1 on the top surface (e.g., a first surface) of the semiconductor pattern SP of a respective layer, and the second gate electrode GE2 on the bottom surface (e.g., a second surface) of the semiconductor pattern SP of the respective layer.

Although not illustrated, the gate electrode GE may include the connection gate electrode connecting the first gate electrode GE1 to the second gate electrode GE2 between the semiconductor patterns SP that are spaced apart in the first direction D1 at the same level, but is not limited thereto.

Figure 6:
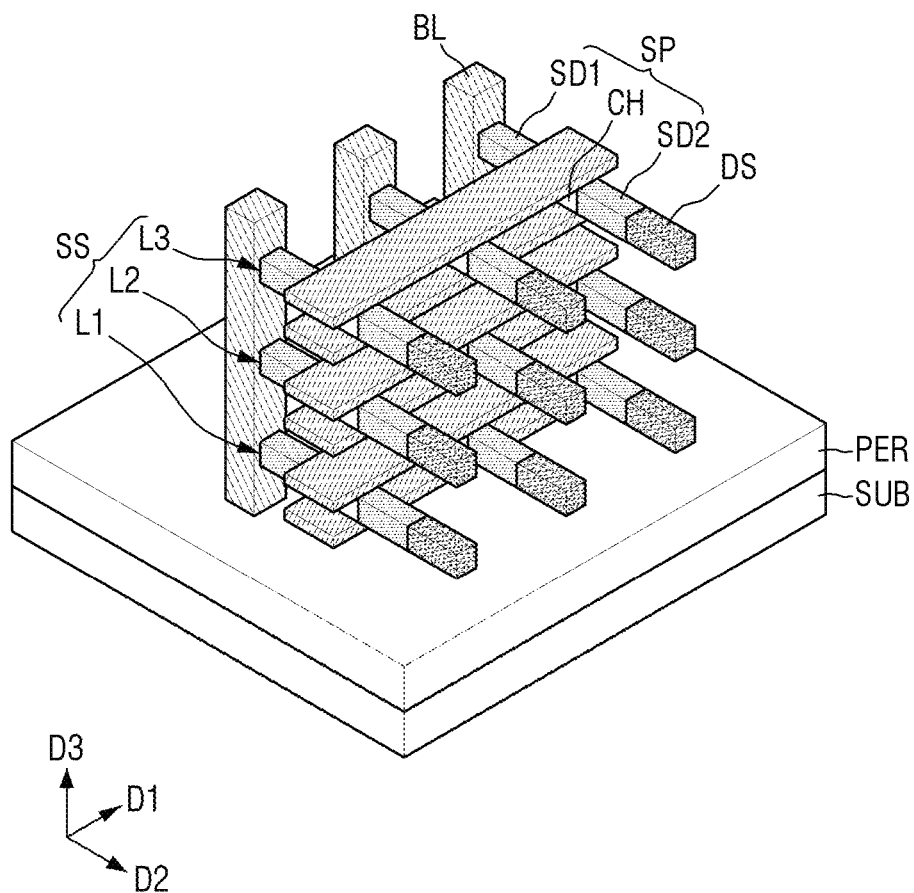
Figure 7:
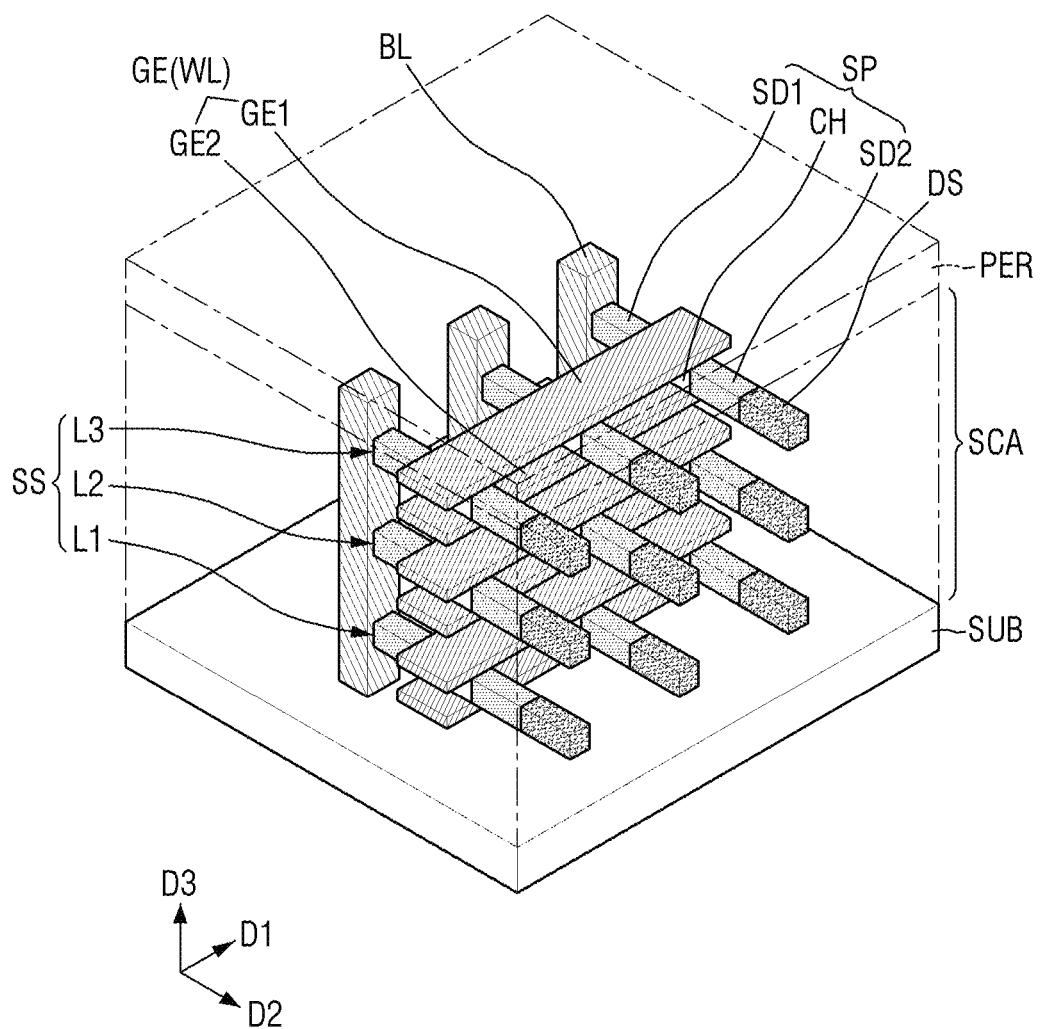

Referring to FIGS. 1, 6, and 7, according to at least one example embodiment, a peripheral circuit area PER and the sub-cell array SCA may be stacked in a vertical direction (e.g., the third direction D3), but the example embodiments are not limited thereto.

For reference, each of FIGS. 6 and 7 is illustrated using FIG. 3, but is not limited thereto. According to some example embodiments, the structure of the sub-cell array SCA of FIGS. 6 and 7 may have the structures described with reference to FIGS. 2, 4, and 5, but are not limited thereto.

In FIG. 6, the peripheral circuit area PER may be between the substrate SUB and the plurality of sub-cell arrays SCA, but is not limited thereto.

The peripheral circuit area PER may include peripheral circuit transistors formed on the substrate SUB. The peripheral circuit area PER may include at least one circuit (e.g., circuitry, device, controller, processor, system, etc.) for operating a 3D semiconductor memory device according to some example embodiments.

The sub-cell array SCA described with reference to FIG. 3 may be on the peripheral circuit area PER. Specifically, the stacked structure SS including the plurality of layers, e.g., first to third layers L1, L2, and L3, etc., may be included on (e.g., arranged on, disposed on, connected to, etc.) the peripheral circuit area PER, but is not limited thereto.

The wire layer electrically connected to the sub-cell array SCA may be electrically connected to the peripheral circuit area PER through, for example, at least one through contact and/or via contact, etc., but the example embodiments are not limited thereto.

In FIG. 7, the sub-cell array SCA may be included on, disposed on, arranged on, and/or connected to the substrate SUB. The peripheral circuit area PER may be included on, disposed on, arranged on, and/or connected to the sub-cell array SCA.

As described above, the peripheral circuit area PER may include at least one circuit for operating the sub-cell array SCA, but is not limited thereto.

For example, the peripheral circuit area PER may be electrically connected to the sub-cell array SCA through, for example, a through contact and/or via contact, etc.

As another example, the peripheral circuit area PER may include a peripheral circuit wire layer electrically connected to at least one circuit for operating the sub-cell array SCA. The wire layer electrically connected to the sub-cell array SCA may be arranged so that the wire layer and the peripheral circuit wire layer of the peripheral circuit area PER face each other, but the example embodiments are not limited thereto. Using the wafer bonding method, the wire layer electrically connected to the sub-cell array SCA may be electrically connected to the peripheral circuit wire layer of the peripheral circuit area PER.

Figure 8:
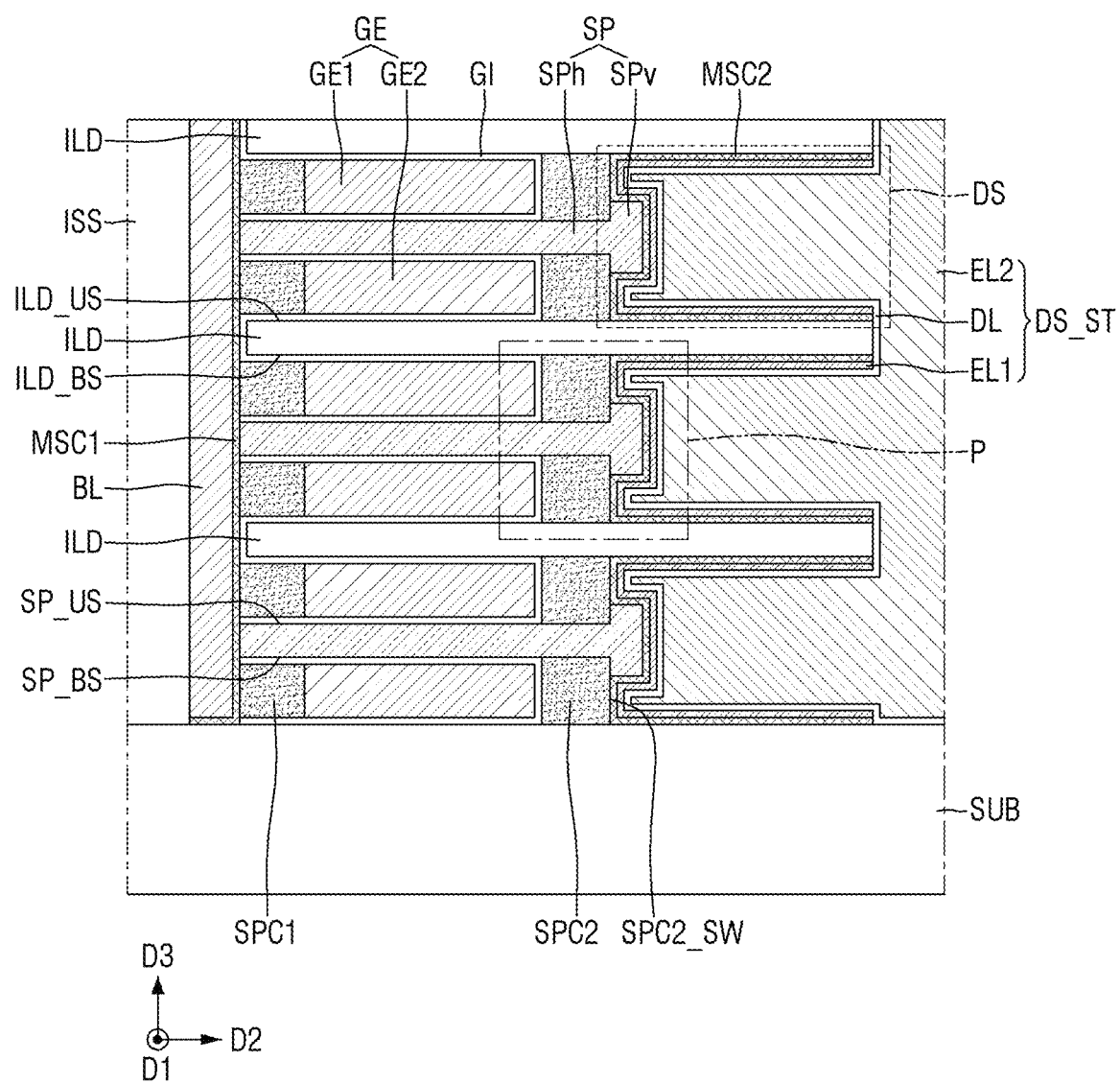
FIG. 8 is a diagram illustrating a semiconductor memory device according to at least one example embodiment.

FIG. 8 is a diagram illustrating a semiconductor memory device according to at least one example embodiment. Each of FIGS. 9 to 12 is an enlarged view of portion P of FIG. 8 according to some example embodiments.

For reference, FIG. 8 may be an example cross-sectional view of a portion of the semiconductor patterns SP stacked in the third direction D3 in FIG. 3 or 4, taken along the second direction D2.

For simplicity of description, description of redundant parts of FIGS. 1 to 4 will be omitted, and the following description is mainly directed to the differences from FIGS. 1 to 4.

Referring to FIGS. 8 to 12, the semiconductor memory device according to some example embodiments may include the bit line BL, the gate electrode GE, the semiconductor pattern SP, and/or the information storage element DS, but is not limited thereto.

The plurality of mold insulating layers ILD may be included on (e.g., arranged on, disposed on, etc.) the substrate SUB. Each mold insulating layer ILD may be spaced apart from each other in the third direction D3, but is not limited thereto. Although it is illustrated that there are three mold insulating layers ILD, they are for simplicity of description only, and the example embodiments are not limited thereto.

Each mold insulating layer ILD may include a top surface (e.g., first surface) ILD_US and a bottom surface (e.g., second surface) ILD_BS that are opposite to each other in the third direction D3. The plurality of mold insulating layers ILD may include a first mold insulating layer ILD and a second mold insulating layer ILD that are adjacent in the third direction D3, but is not limited thereto. The first mold insulating layer ILD may be closer to the substrate SUB than the second mold insulating layer ILD. In this case, the top surface ILD_US of the first mold insulating layer may face the bottom surface ILD_BS of the second mold insulating layer.

The mold insulating layer ILD may include an insulating material, but is not limited thereto. The mold insulating layer ILD may include, for example, at least one of a silicon oxide layer, a silicon nitride layer, a silicon oxynitride layer, a carbon-containing silicon oxide layer, a carbon-containing silicon nitride layer, and/or a carbon-containing silicon oxynitride layer, etc. For example, the mold insulating layer ILD may include a silicon oxide layer.

Although it is illustrated in FIG. 8 that the mold insulating layer ILD positioned at the lowermost portion is spaced apart from the substrate SUB, and the semiconductor pattern SP and the gate electrode GE are located between the mold insulating layer ILD and the substrate SUB, the example embodiments are not limited thereto. Unlike the illustrations of FIGS. 1 to 4, according to some example embodiments, for example, the mold insulating layer ILD positioned at the lowermost portion may be in contact with the substrate SUB, etc. As another example, an etch stop layer located along the top surface of the substrate SUB may be also be between the gate electrode GE and the substrate SUB at the lowermost portion, etc.

The plurality of semiconductor patterns SP may be between the mold insulating layers ILD adjacent in the third direction D3, but are not limited thereto. Each of the semiconductor patterns SP may be spaced apart from each other in the third direction D3, etc.

In other words, the plurality of semiconductor patterns SP may be spaced apart in the third direction D3 on the substrate SUB, but is not limited thereto. The mold insulating layer ILD may be between the semiconductor patterns SP adjacent in the third direction D3, but is not limited thereto. According to some example embodiments, the mold insulating layer ILD may not be between the semiconductor pattern SP at the lowermost portion and the substrate SUB, but the example embodiments are not limited thereto.

Each semiconductor pattern SP may extend in the second direction D2 (e.g., a direction perpendicular to the direction of the plurality of semiconductor patterns SP on the substrate semiconductor SUB), but are not limited thereto. Each semiconductor pattern SP may overlap a portion of the top surface ILD_US of the mold insulating layer and a portion of the bottom surface ILD_BS of the mold insulating layer that face each other, in the third direction D3, but are not limited thereto. In other words, the mold insulating layer ILD may protrude in the second direction D2 in comparison and/or relation to the semiconductor pattern SP.

Each semiconductor pattern SP may include a horizontal portion SPh and a vertical portion SPv. The horizontal portion SPh of the semiconductor pattern may extend in the second direction D2, but is not limited thereto. The vertical portion SPv of the semiconductor pattern may extend in the third direction D3, but is not limited thereto.

The horizontal portion SPh of the semiconductor pattern is directly connected to the vertical portion SPv of the semiconductor pattern. When the horizontal portion SPh of the semiconductor pattern includes one end (e.g., first end) and the other end (e.g., second end) that are opposite to each other in the second direction D2, one end (e.g., the first end) of the horizontal portion SPh of the semiconductor pattern is connected to the bit line BL, and the other end (e.g., the second end) of the horizontal portion SPh of the semiconductor pattern is directly connected to the vertical portion SPv of the semiconductor pattern.

The horizontal portion SPh of the semiconductor pattern may include a top surface (e.g., first surface) SP_US and a bottom surface (e.g., second surface) SP_BS opposite to each other in the third direction D3. In the semiconductor memory device according to some example embodiments, the mold insulating layer ILD may protrude in the second direction D2 in comparison and/or relation to the vertical portion SPv of the semiconductor pattern.

For example, a thickness t11 of the horizontal portion SPh of the semiconductor pattern in the third direction D3 is smaller than a thickness t12 of the vertical portion SPv of the semiconductor pattern in the third direction D3, but the example embodiments are not limited thereto. For example, the semiconductor pattern SP may generally have a T shape that is rotated by 90 degrees (e.g., a shape resembling an uppercase letter "T" which is rotated by 90 degrees to a horizontal orientation from a vertical orientation), but the example embodiments are not limited thereto. Additionally, because a thickness t11 of the horizontal portion SPh of the semiconductor pattern in the third direction D3 is smaller than a thickness t12 of the vertical portion SPv of the semiconductor pattern in the third direction D3, the 3D semiconductor memory device may have improved electrical characteristics and/or reliability due to the increase of the contact area between the semiconductor pattern and the silicide pattern, thereby creating a low-resistance ohmic contact.

Since the semiconductor pattern SP is located between the adjacent mold insulating layers ILD, a height H between the adjacent mold insulating layers ILD in the third direction D3 may be greater than or equal to the thickness t12 of the vertical portion SPv of the semiconductor pattern in the third direction D3, but the example embodiments are not limited thereto. For example, when the plurality of mold insulating layers ILD include the first mold insulating layer ILD and the second mold insulating layer ILD that are adjacent in the third direction D3, the height H between the first mold insulating layer ILD and the second mold insulating layer ILD that are adjacent may be greater than or equal to the thickness t12 of the vertical portion SPv of the semiconductor pattern in the third direction D3, but the example embodiments are not limited thereto.

In the semiconductor memory device according to some example embodiments, the height H by which the first mold insulating layer ILD and the second mold insulating layer ILD, which are adjacent, are spaced apart is greater than the thickness t12 of the vertical portion SPv of the semiconductor pattern in the third direction D3, but the example embodiments are not limited thereto.

The vertical portion SPv of the semiconductor pattern is illustrated to have a quadrangular shape for simplicity of description, but is not limited thereto.

The semiconductor pattern SP may include at least one of polysilicon, polysilicon germanium, monocrystalline silicon, and/or monocrystalline silicon-germanium, etc.

Figure 9:
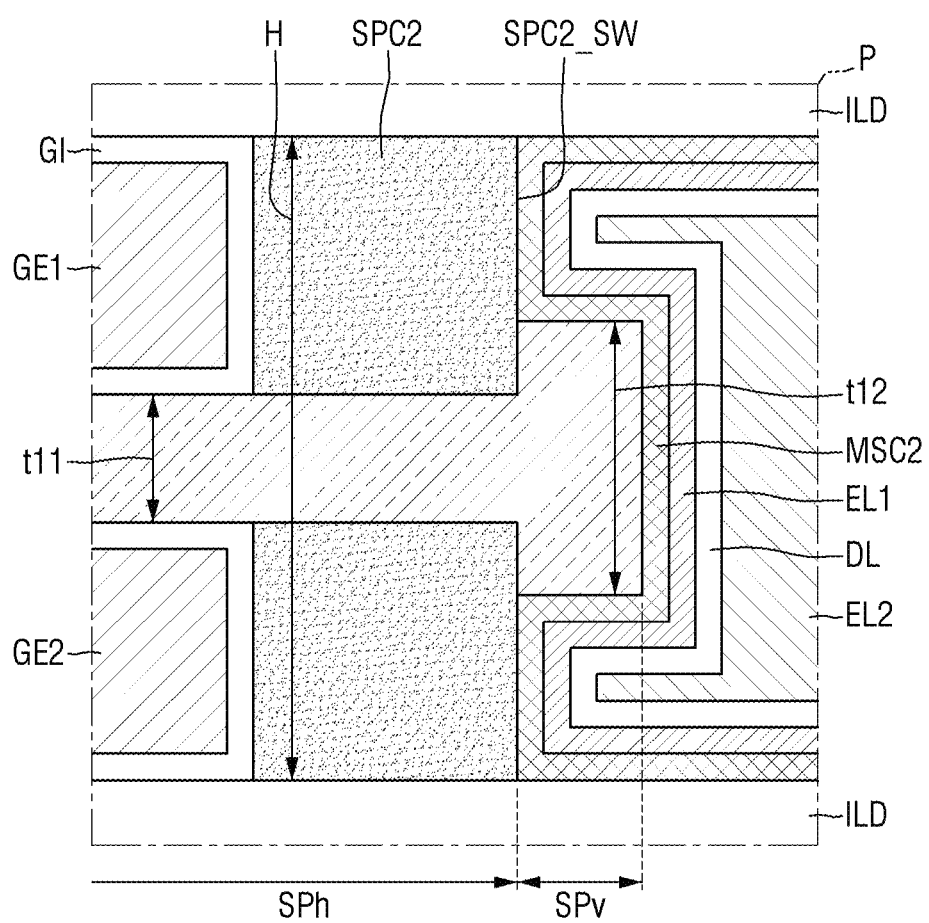
FIGS. 9 to 12 are each an enlarged view of portion P of FIG. 8 according to some example embodiments.

In FIG. 9, the semiconductor pattern SP may be a structure formed of one pattern. That is, the horizontal portion SPh of the semiconductor pattern and the vertical portion SPv of the semiconductor pattern may include the same material, but the example embodiments are not limited thereto. In addition, there may be no boundary between the horizontal portion SPh of the semiconductor pattern and the vertical portion SPv of the semiconductor pattern, but the example embodiments are not limited thereto.

Figure 10:
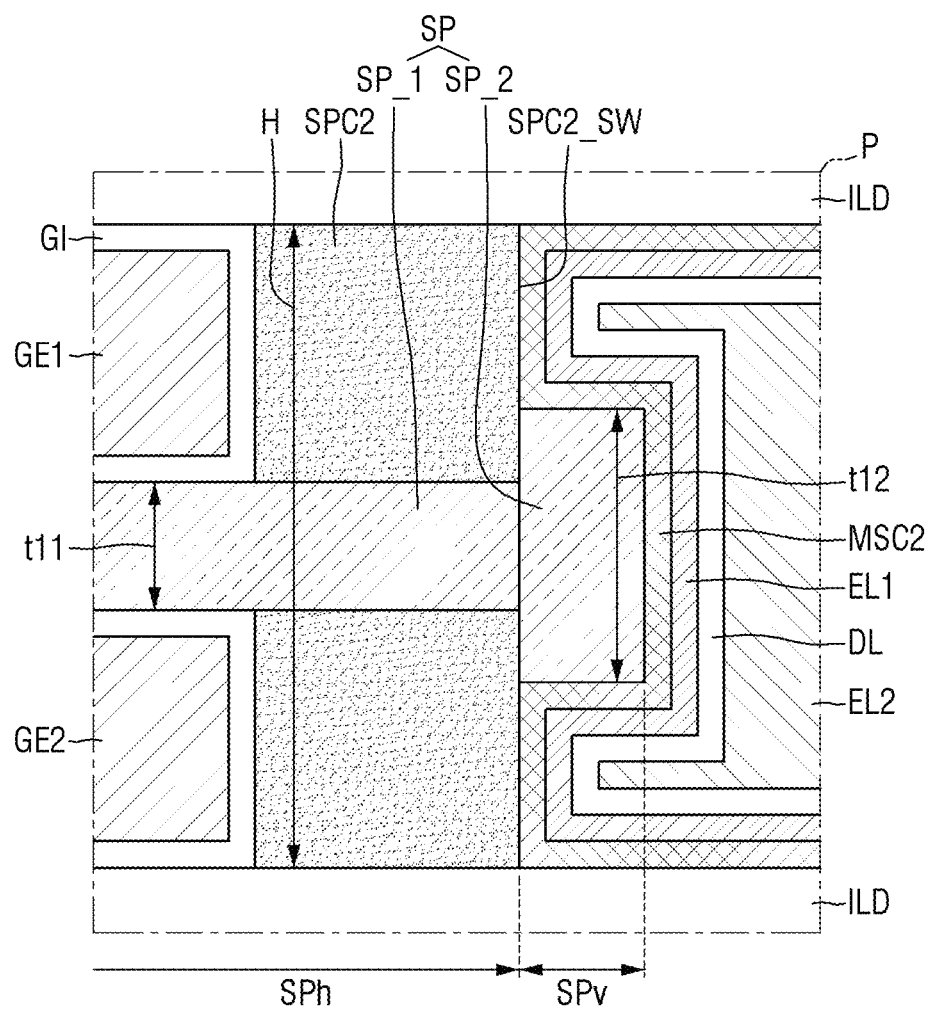
Figure 11:
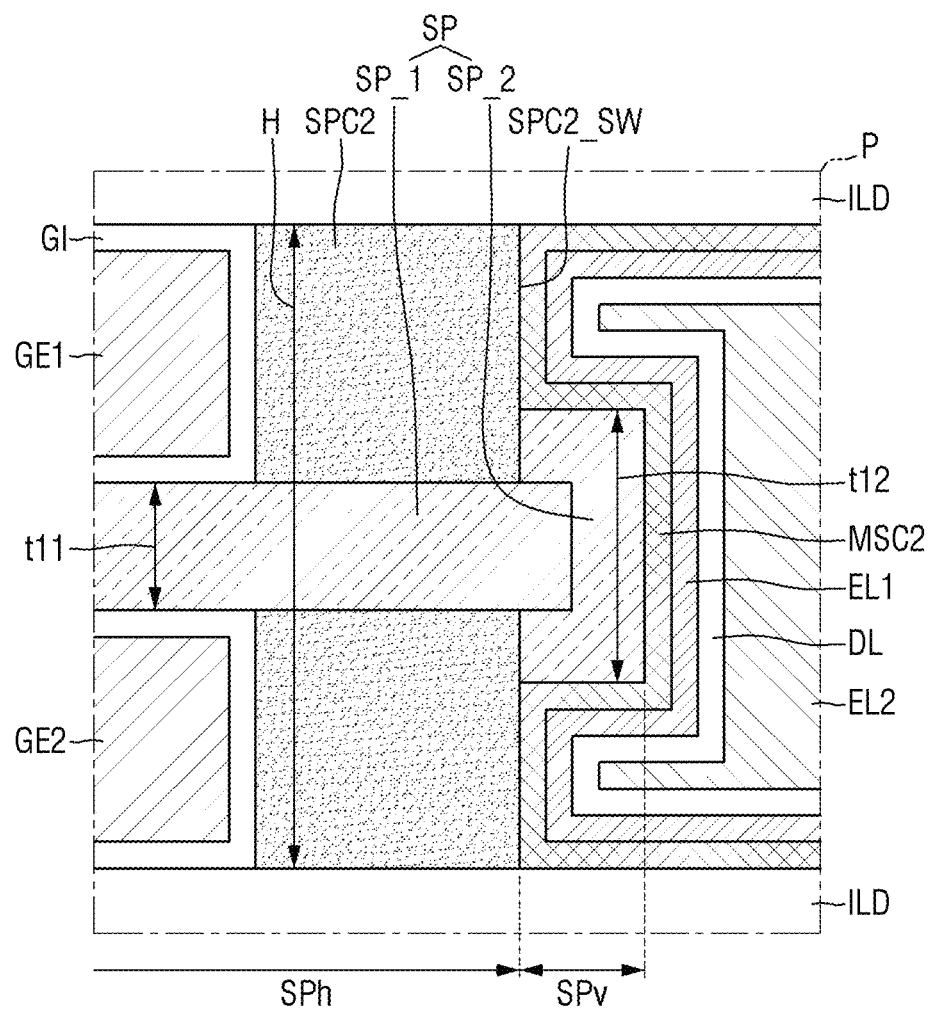
Figure 12:
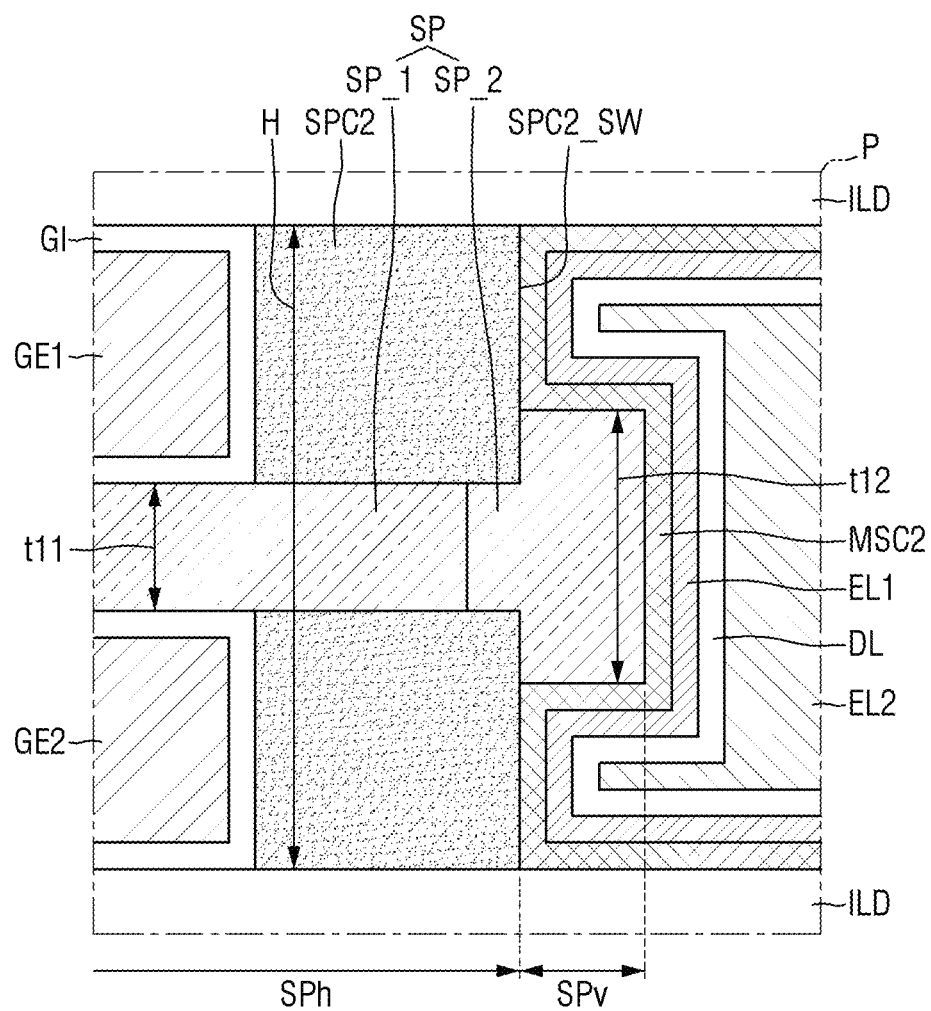

In FIGS. 10 to 12, the semiconductor pattern SP may include a first sub-semiconductor pattern SP_1 and a second sub-semiconductor pattern SP_2, etc., but the example embodiments are not limited thereto, and for example, the semiconductor pattern SP may include a lesser or greater number of sub-semiconductor patterns, etc. A boundary may exist between the first sub-semiconductor pattern SP_1 and the second sub-semiconductor pattern SP_2, but the example embodiments are not limited thereto.

For example, the first sub-semiconductor pattern SP_1 and the second sub-semiconductor pattern SP_2 may include the same material, but is not limited thereto. Although the first sub-semiconductor pattern SP_1 and the second sub-semiconductor pattern SP_2 include the same material, a boundary between the first sub-semiconductor pattern SP_1 and the second sub-semiconductor pattern SP_2 may be distinguished according to the crystal state and/or doping state of the material, etc.

As another example, the first sub-semiconductor pattern SP_1 and the second sub-semiconductor pattern SP_2 may include different materials (e.g., a plurality of materials). For example, when the first sub-semiconductor pattern SP_1 includes a first semiconductor material and the second sub-semiconductor pattern SP_2 includes a second semiconductor material, the lattice constant of the first semiconductor material may be smaller than the lattice constant of the second semiconductor material, but the example embodiments are not limited thereto. For example, the first sub-semiconductor pattern SP_1 may include silicon, and the second sub-semiconductor pattern SP_2 may include silicon-germanium, but the example embodiments are not limited thereto.

In FIG. 10, according to at least one example embodiment, the horizontal portion SPh of the semiconductor pattern includes the first sub-semiconductor pattern SP_1. The vertical portion SPv of the semiconductor pattern includes the second sub-semiconductor pattern SP_2. The horizontal portion SPh of the semiconductor pattern and the vertical portion SPv of the semiconductor pattern may be distinguished through a boundary between the first sub-semiconductor pattern SP_1 and the second sub-semiconductor pattern SP_2, etc.

In FIG. 11, according to at least one example embodiment, the horizontal portion SPh of the semiconductor pattern includes the first sub-semiconductor pattern SP_1. The vertical portion SPv of the semiconductor pattern includes a portion of the first sub-semiconductor pattern SP_1 and the second sub-semiconductor pattern SP_2.

In FIG. 12, according to at least one example embodiment, the vertical portion SPv of the semiconductor pattern includes the second sub-semiconductor pattern SP_2. The horizontal portion SPh of the semiconductor pattern includes a portion of the second sub-semiconductor pattern SP_2 and the first sub-semiconductor pattern SP_1.

According to some example embodiments, the plurality of gate electrodes GE may be between the mold insulating layers ILD adjacent in the third direction D3, but the example embodiments are not limited thereto. Each gate electrode GE may be arranged on, included on, disposed on, etc., each semiconductor pattern SP, but are not limited thereto. Each gate electrode GE may be on the horizontal portion SPh of the semiconductor pattern, but the example embodiments are not limited thereto. Each gate electrode GE may extend in the first direction D1, but is not limited thereto.

When the plurality of mold insulating layers ILD include the first mold insulating layer ILD and the second mold insulating layer ILD that are adjacent in the third direction D3, the semiconductor pattern SP and the gate electrode GE may be between the adjacent first mold insulating layer ILD and second mold insulating layer ILD that are adjacent to each other, but the example embodiments are not limited thereto.

According to at least one example embodiment, each gate electrode GE may include a plurality of gate electrodes, such as the first gate electrode GE1 and the second gate electrode GE2, etc., spaced apart in the third direction D3, but are not limited thereto. Each of the gate electrodes, e.g., first gate electrode GE1 and the second gate electrode GE2, etc., may extend in the first direction D1, etc.

The first gate electrode GE1 may be on the top surface SP US of the horizontal portion of the semiconductor pattern. The second gate electrode GE2 may be on the bottom surface SP BS of the horizontal portion of the semiconductor pattern. The first gate electrode GE1 may be an upper gate electrode, and the second gate electrode GE2 may be a lower gate electrode, etc.

Each semiconductor pattern SP may be between the first gate electrode GE1 and the second gate electrode GE2, but are not limited thereto. The horizontal portion SPh of the semiconductor pattern may be between the first gate electrode GE1 and the second gate electrode GE2.

According to some example embodiments, the first gate electrode GE1 and the second gate electrode GE2 may overlap the horizontal portion SPh of the semiconductor pattern in the third direction D3. The first gate electrode GE1 and the second gate electrode GE2 do not overlap the vertical portion SPv of the semiconductor pattern in the third direction D3 according to some example embodiments.

For example, a portion of the semiconductor pattern SP may overlap the first gate electrode GE1 and the second gate electrode GE2 in the second direction D2. More specifically, the vertical portion SPv of the semiconductor pattern may overlap the first gate electrode GE1 and the second gate electrode GE2 in the second direction D2.

Unlike the illustrations in FIGS. 1 to 4, according to some example embodiments, the vertical portion SPv of the semiconductor pattern may overlap one of the first gate electrode GE1 and the second gate electrode GE2 in the second direction D2, for example.

Unlike the illustrations in FIGS. 1 to 4, as another example, the vertical portion SPv of the semiconductor pattern may not overlap the first gate electrode GE1 and the second gate electrode GE2 in the second direction D2. In this case, the vertical portion SPv of the semiconductor pattern may overlap a gate insulating layer GI between the gate electrode GE and the horizontal portion SPh of the semiconductor pattern in the second direction D2.

The gate insulating layer GI may be between the first gate electrode GE1 and the horizontal portion SPh of the semiconductor pattern, and between the first gate electrode GE1 and the mold insulating layer ILD, but is not limited thereto. Additionally, the gate insulating layer GI may be between the second gate electrode GE2 and the horizontal portion SPh of the semiconductor pattern, and between the second gate electrode GE2 and the mold insulating layer ILD, etc.

The gate insulating layer GI may be on a sidewall of the first gate electrode GE1 adjacent to the vertical portion SPv of the semiconductor pattern and extending in the third direction D3. Additionally, the gate insulating layer GI may be on a sidewall of the second gate electrode GE2 adjacent to the vertical portion SPv of the semiconductor pattern and extending in the third direction D3, etc. Further, the gate insulating layer GI may be on a sidewall connecting the top surface ILD_US of the mold insulating layer to the bottom surface ILD_BS of the mold insulating layer, but the example embodiments are not limited thereto.

The gate insulating layer GI may include, for example, at least one of a high-k insulating layer, a silicon oxide layer, a silicon nitride layer, and/or a silicon oxynitride layer, etc.

Referring again to FIG. 8, according to some example embodiments, the bit line BL may extend on the substrate SUB in the third direction D3. The bit line BL may be connected to the plurality of semiconductor patterns SP spaced apart in the third direction D3. The bit line BL may be connected to the horizontal portion SPh of the semiconductor pattern.

In the semiconductor memory device according to some example embodiments, the bit line BL is not interposed between the mold insulating layers ILD adjacent in the third direction D3, but is not limited thereto. The bit line BL does not include a portion extending in the second direction D2 between the mold insulating layers ILD, but is not limited thereto.

Referring again to FIG. 8, a separation insulating structure ISS may be located on the substrate SUB. The separation insulating structure ISS may spatially separate the bit lines BL adjacent in the second direction D2, but are not limited thereto. The separation insulating structure ISS may include, for example, an insulating material, etc.

A first spacer pattern SPC1 may be located between the horizontal portion SPh of the semiconductor pattern and the mold insulating layer ILD, but the example embodiments are not limited thereto. The first spacer pattern SPC1 may be on the top surface (e.g., first surface) SP US of the horizontal portion of the semiconductor pattern and/or the bottom surface SP BS of the horizontal portion of the semiconductor pattern, but the example embodiments are not limited thereto.

The first spacer pattern SPC1 may spatially separate the gate electrode GE and the bit line BL. The gate insulating layer GI may be interposed between the first spacer pattern SPC1 and the horizontal portion SPh of the semiconductor pattern, and between the first spacer pattern SPC1 and the mold insulating layer ILD, etc. Unlike the illustrations of FIGS. 1 to 4, according to some example embodiments, the gate insulating layer GI may not be interposed between the first spacer pattern SPC1 and the horizontal portion SPh of the semiconductor pattern, and may not be between the first spacer pattern SPC1 and the mold insulating layer ILD.

According to some example embodiments, the second spacer pattern SPC2 may be between the horizontal portion SPh of the semiconductor pattern and the mold insulating layer ILD. The second spacer pattern SPC2 may be on the top surface (e.g., a first surface) SP US of the horizontal portion of the semiconductor pattern and/or on the bottom surface (e.g., a second surface) SP BS of the horizontal portion of the semiconductor pattern, but the example embodiments are not limited thereto.

Additionally, the second spacer pattern SPC2 may be interposed between the gate electrode GE and the vertical portion SPv of the semiconductor pattern. The second spacer pattern SPC2 does not overlap the vertical portion SPv of the semiconductor pattern in the third direction D3.

The second spacer pattern SPC2 may include a sidewall SPC2_SW extending in the third direction D3. The horizontal portion SPh of the semiconductor pattern and the vertical portion SPv of the semiconductor pattern may be distinguished based on a sidewall adjacent to the information storage element DS among the sidewalls SPC2_SW of the second spacer pattern.

According to some example embodiments, the gate insulating layer GI may not be interposed between the second spacer pattern SPC2 and the horizontal portion SPh of the semiconductor pattern, and may not be between the second spacer pattern SPC2 and the mold insulating layer ILD.

Unlike the illustrations of FIGS. 1 to 4, according to some example embodiments, the second spacer pattern SPC2 may not be between the gate electrode GE and the vertical portion SPv of the semiconductor pattern. Since the gate insulating layer GI is between the gate electrode GE and the vertical portion SPv of the semiconductor pattern, the gate electrode GE and the vertical portion SPv of the semiconductor pattern may be electrically insulated.

Each of the first spacer pattern SPC1 and the second spacer pattern SPC2 may include at least one of, for example, a silicon oxide layer, a silicon nitride layer, a silicon oxynitride layer, a carbon-containing silicon oxide layer, a carbon-containing silicon nitride layer, and/or a carbon-containing silicon oxynitride layer, etc., but are not limited thereto.

A first silicide pattern MSC1 may be between the bit line BL and the semiconductor pattern SP. The first silicide pattern MSC1 may extend along the semiconductor pattern SP, a sidewall of the first spacer pattern SPC1, and/or a sidewall of the mold insulating layer ILD, but is not limited thereto.

The first silicide pattern MSC1 may be in contact with the plurality of semiconductor patterns SP. The first silicide pattern MSC1 may be in contact with the horizontal portions SPh of the plurality of semiconductor patterns spaced apart in the third direction D3.

A plurality of second silicide patterns MSC2 may be between the mold insulating layers ILD. Each second silicide pattern MSC2 may be in contact with each semiconductor pattern SP. Each second silicide pattern MCS2 may be in contact with the vertical portion SPv of the semiconductor pattern, but is not limited thereto.

In the semiconductor memory device according to some example embodiments, the second silicide pattern MSC2 may include a portion extending in the second direction D2 along the top surface ILD_US of the mold insulating layer and the bottom surface ILD_BS of the mold insulating layer, but is not limited thereto. A portion of the second silicide pattern MSC2 may include a portion extending along a sidewall SPC_SW of the second spacer pattern, etc.

When the plurality of mold insulating layers ILD include the first mold insulating layer ILD and the second mold insulating layer ILD that are adjacent in the third direction D3, the second silicide pattern MSC2 may extend along the top surface ILD_US of the first mold insulating layer and the bottom surface ILD_BS of the second mold insulating layer that face in the third direction D3, but the example embodiments are not limited thereto. The second silicide pattern MSC2 may include a portion extending along the first mold insulating layer ILD and the second mold insulating layer ILD protruding in the second direction D2 in comparison to and/or in relation to the vertical portion SPv of the semiconductor pattern.

Each of the first silicide pattern MSC1 and the second silicide pattern MSC2 may include a metal silicide material (e.g., a metal-silicon compound) and/or a metal nitride silicide material (e.g., a metal nitride-silicon compound), but are not limited thereto. Each of the first silicide pattern MSC1 and the second silicide pattern MSC2 may include, for example, a silicide material containing one metal of titanium (Ti), niobium (Nb), molybdenum (Mo), tungsten (W), cobalt (Co), platinum (Pt), and/or erbium (Er), etc., but is not limited thereto.

An information storage element structure DS_ST may include the plurality of information storage elements DS.

Each information storage elements DS may be located between the mold insulating layers ILD adjacent in the third direction D3, but are not limited thereto.

Each information storage element DS may be connected to a respective and/or corresponding semiconductor pattern SP of the plurality of semiconductor patterns SP. Each information storage element DS may be connected to the vertical portion SPv of the respective and/or corresponding semiconductor pattern SP, but the example embodiments are not limited thereto.

In the semiconductor memory device according to some example embodiments, each of the information storage elements DS may be between the mold insulating layers ILD protruding in the second direction D2 in comparison to and/or in relation to the vertical portion SPv of the semiconductor pattern. When the plurality of mold insulating layers ILD include, for example, the first mold insulating layer ILD and the second mold insulating layer ILD that are adjacent in the third direction D3, each information storage element DS may be between the first mold insulating layer ILD and the second mold insulating layer ILD protruding in the second direction D2 in comparison to and/or in relation to the vertical portion SPv of the semiconductor pattern, but the example embodiments are not limited thereto.

Each information storage element DS may be connected to a respective and/or corresponding second silicide pattern MSC2 of the plurality of second silicide patterns MSC2. The second silicide pattern MSC2 may be along a boundary between the information storage element DS and the vertical portion SPv of the semiconductor pattern, but is not limited thereto.

Each information storage element DS may be a capacitor, but is not limited thereto. The information storage element structure DS_ST including the plurality of information storage elements DS may be a capacitor structure, but is not limited thereto.

For example, the information storage element structure DS_ST may include a capacitor dielectric layer DL, an upper electrode EL2, and/or a plurality of lower electrodes EL1, etc. Each information storage element DS may include the lower electrode EL1, the capacitor dielectric layer DL, and/or the upper electrode EL2 that are between the mold insulating layers ILD, but is not limited thereto. Each information storage element DS may be defined by each lower electrode EL1, etc.

Each lower electrode EL1 may be between the mold insulating layers ILD adjacent in the third direction D3, but is not limited thereto. The lower electrode EL1 may be connected to the second silicide pattern MSC2. The lower electrode EL1 may be in contact with the second silicide pattern MSC2, but is not limited thereto.

In the semiconductor memory device according to some example embodiments, each lower electrode EL1 may extend along a profile of each second silicide pattern MSC2. In other words, each second silicide pattern MSC2 may extend along a profile of each lower electrode EL1.

The lower electrodes EL1 included in each information storage element DS are separated from each other. The lower electrode EL1 adjacent in the third direction D3 may be separated by the mold insulating layer ILD, but the example embodiments are not limited thereto.

The capacitor dielectric layer DL1 may be on the lower electrode EL1. The capacitor dielectric layer DL1 may extend along the profile of the plurality of lower electrodes EL1, but the example embodiments are not limited thereto. The upper electrode EL2 may be on the capacitor dielectric layer DL. The capacitor dielectric layer DL and the upper electrode EL2 may be sequentially on the lower electrode EL1, but the example embodiments are not limited thereto.

The capacitor dielectric layer DL and the upper electrode EL2 included in each information storage element DS may be connected to each other.

Each of the lower electrode EL1 and the upper electrode EL2 may include, for example, a doped semiconductor material, conductive metal nitride (e.g., titanium nitride, tantalum nitride, niobium nitride, or tungsten nitride), metal (e.g., ruthenium, iridium, titanium, niobium, tungsten, cobalt, molybdenum, or tantalum), conductive metal oxide (e.g., iridium oxide or niobium oxide), and the like, but the example embodiments of the inventive concepts are not limited thereto. For example, the lower electrode EL1 may include conductive metal nitride, metal, and/or conductive metal oxide, etc. Conductive metal nitride, metal, and/or conductive metal oxide may be included in a metallic conductive layer, but is not limited thereto.

The capacitor dielectric layer DL may include, for example, a high-k material (e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, etc., or any combinations thereof). In the semiconductor memory device according to some example embodiments, the capacitor dielectric layer DL may include a stacked structure in which zirconium oxide, aluminum oxide and zirconium oxide are sequentially stacked, but the example embodiments are not limited thereto. In the semiconductor device according to some example embodiments, the capacitor dielectric layer DL may include hafnium (Hf), etc., but the example embodiments are not limited thereto.

Figure 13:
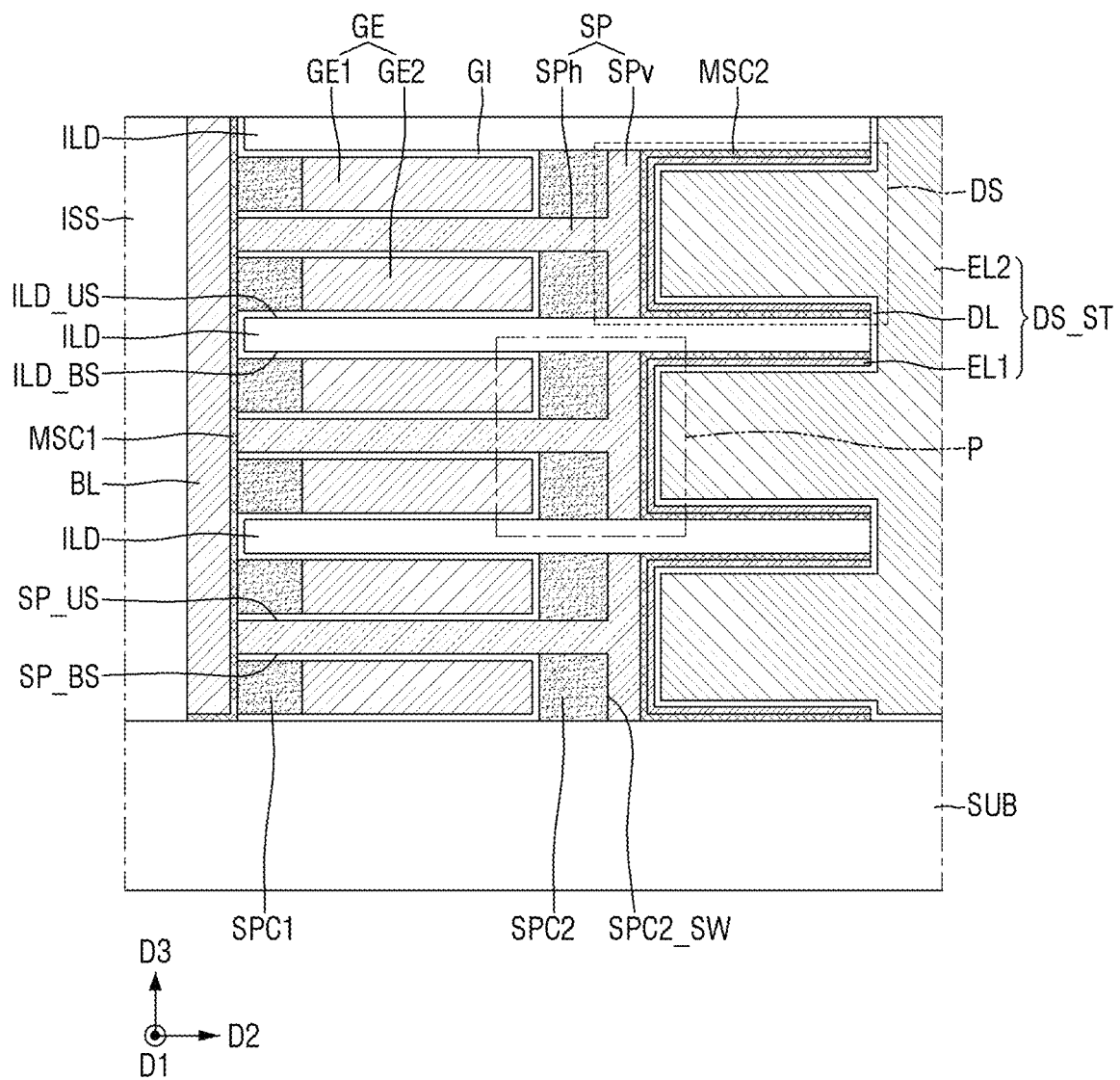
FIG. 13 is a diagram illustrating a semiconductor memory device according to at least one example embodiment.
Figure 14:
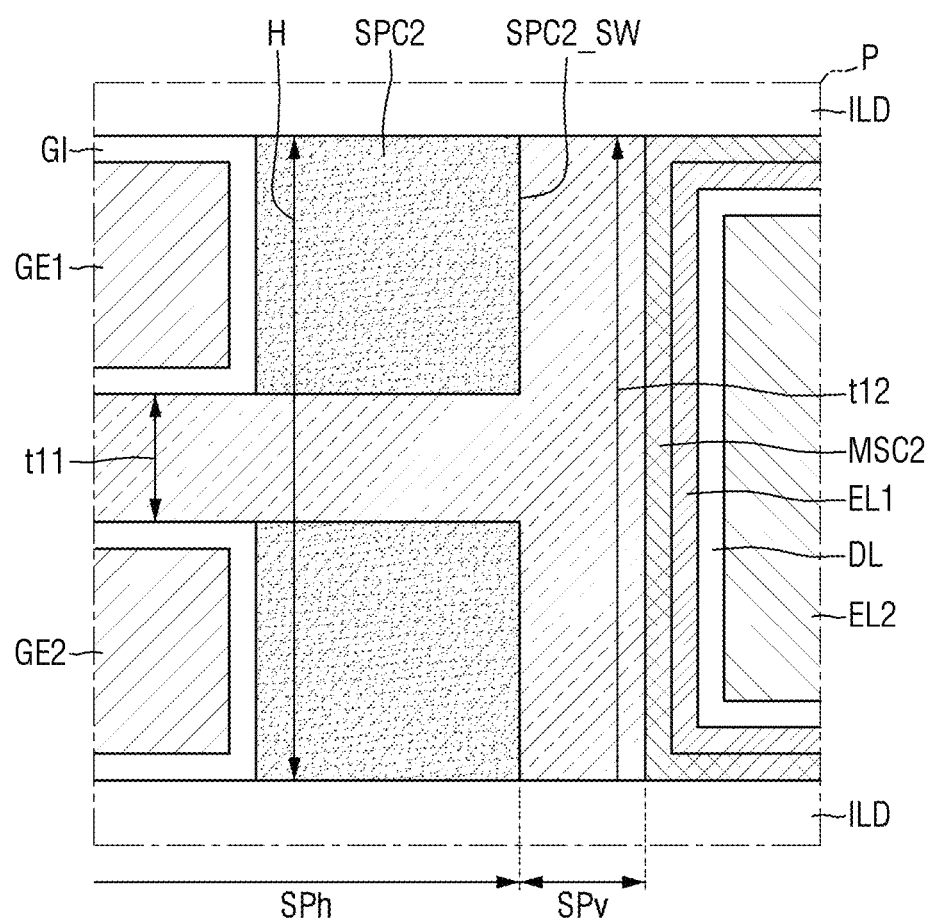
FIG. 14 is an enlarged view of portion P of FIG. 13 according to at least one example embodiment.

FIG. 13 is a diagram illustrating a semiconductor memory device according to at least one example embodiment. FIG. 14 is an enlarged view of portion P of FIG. 13 according to some example embodiments. For simplicity of description, the following description of FIGS. 13 and 14 will focus on the differences from the description of the example embodiments of FIGS. 8 to 12.

Referring to FIGS. 13 and 14, in the semiconductor memory device according to some example embodiments, the height H by which mold insulating layers ILD adjacent in the third direction D3 are spaced apart may be equal to the thickness t12 of the vertical portion SPv of the semiconductor pattern in the third direction D3, but the example embodiments are not limited thereto.

When the plurality of mold insulating layers ILD include the first mold insulating layer ILD and the second mold insulating layer ILD that are adjacent in the third direction D3, the vertical portion SPv of the semiconductor pattern may be in contact with the first mold insulating layer ILD and the second mold insulating layer ILD, but the example embodiments are not limited thereto.

According to some example embodiments, the height H by which the first mold insulating layer ILD and the second mold insulating layer ILD are spaced apart may be equal to the thickness t12 of the vertical portion SPv of the semi-conductor pattern in the third direction D3, but the example embodiments are not limited thereto.

The vertical portion SPv of the semiconductor pattern may entirely cover the sidewall SPC2_SW of the second spacer pattern, but is not limited thereto. According to some example embodiments, the second silicide pattern MSC2 is not in contact with the sidewall SPC2_SW of the second spacer pattern.

Figure 15:
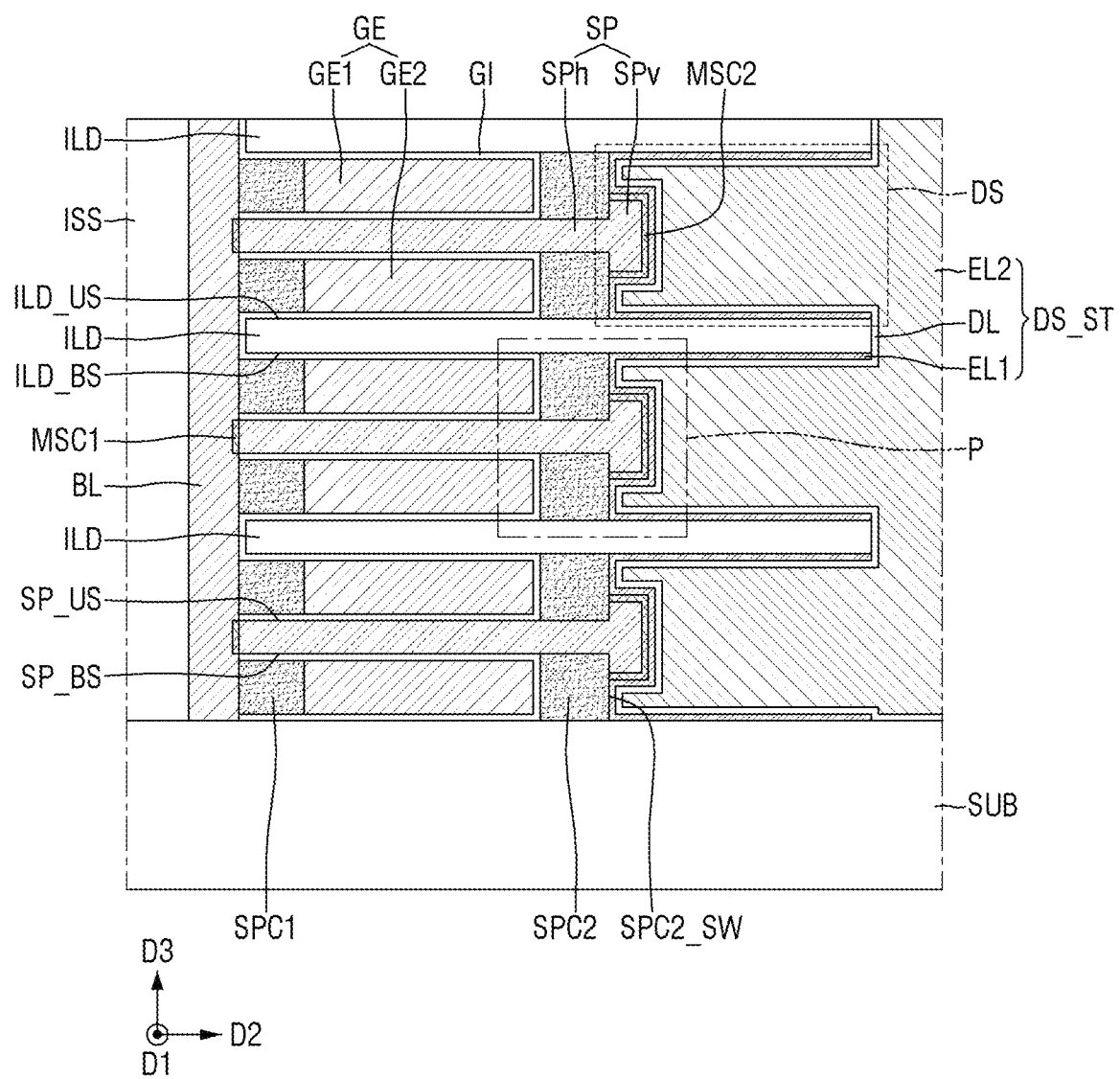
FIG. 15 is a diagram illustrating a semiconductor memory device according to at least one example embodiment.
Figure 16:
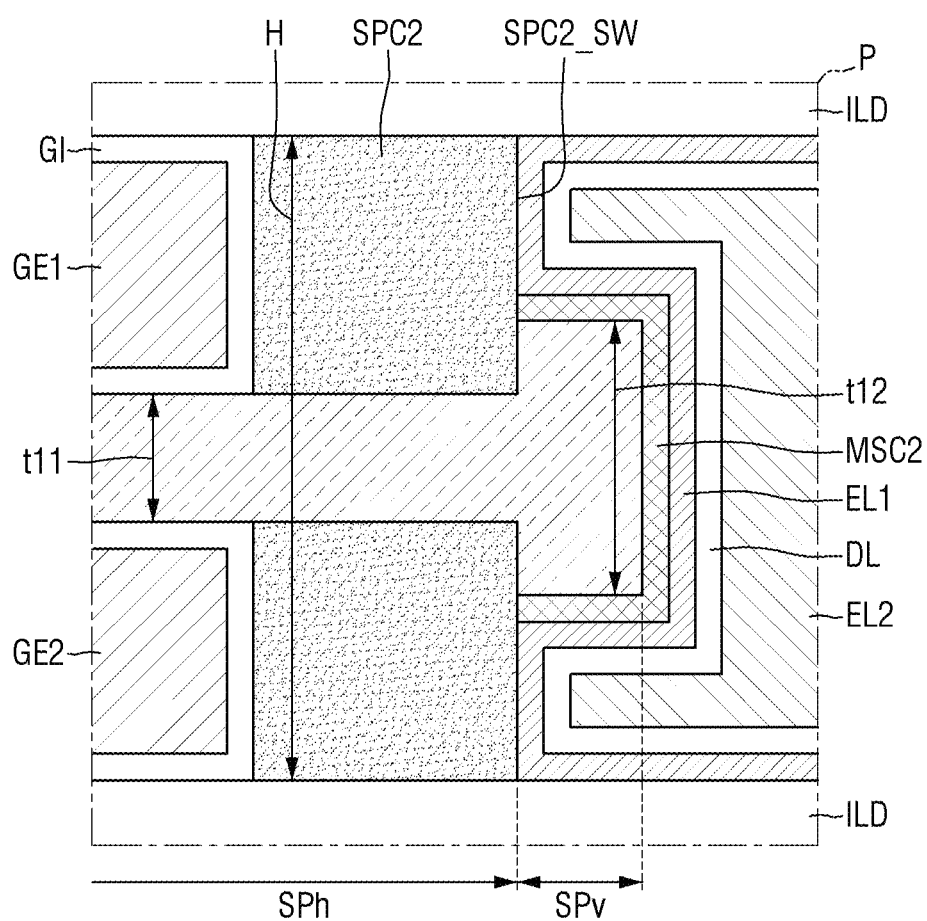
FIG. 16 is an enlarged view of portion P of FIG. 15 according to at least one example embodiment.

FIG. 15 is a diagram illustrating a semiconductor memory device according to at least one example embodiment. FIG. 16 is an enlarged view of portion P of FIG. 15 according to some example embodiments. For simplicity of description, the following description of FIGS. 15 and 16 will focus on the differences between the features of the semiconductor devices of FIGS. 8 to 12.

Referring to FIGS. 15 and 16, in the semiconductor memory device according to some example embodiments, the second silicide pattern MSC2 may be only on the vertical portion SPv of the semiconductor pattern, but the example embodiments are not limited thereto.

The second silicide pattern MSC2 does not include a portion extending in the second direction D2 along the top surface ILD_US of the mold insulating layer and the bottom surface ILD_BS of the mold insulating layer, but the example embodiments are not limited thereto.

The first silicide pattern MSC1 may be only on the horizontal portion SPh of the semiconductor pattern, but is not limited thereto.

The first silicide pattern MSC1 does not include a portion extending along the sidewall of the first spacer pattern SPC1, but is not limited thereto.

Unlike the illustrations of FIGS. 8 to 12, according to at least one example embodiment, the second silicide pattern MSC2 may be only on the vertical portion SPv of the semiconductor pattern. The first silicide pattern MSC1 may include a portion extending along a sidewall of the first spacer pattern SPC1, but is not limited thereto.

Unlike the illustrations of FIGS. 8 to 12, as another example, the second silicide pattern MSC2 may include a portion extending in the second direction D2 along the top surface ILD_US of the mold insulating layer and the bottom surface ILD_BS of the mold insulating layer. The first silicide pattern MSC1 may be only on the horizontal portion SPh of the semiconductor pattern, but is not limited thereto.

Figure 17:
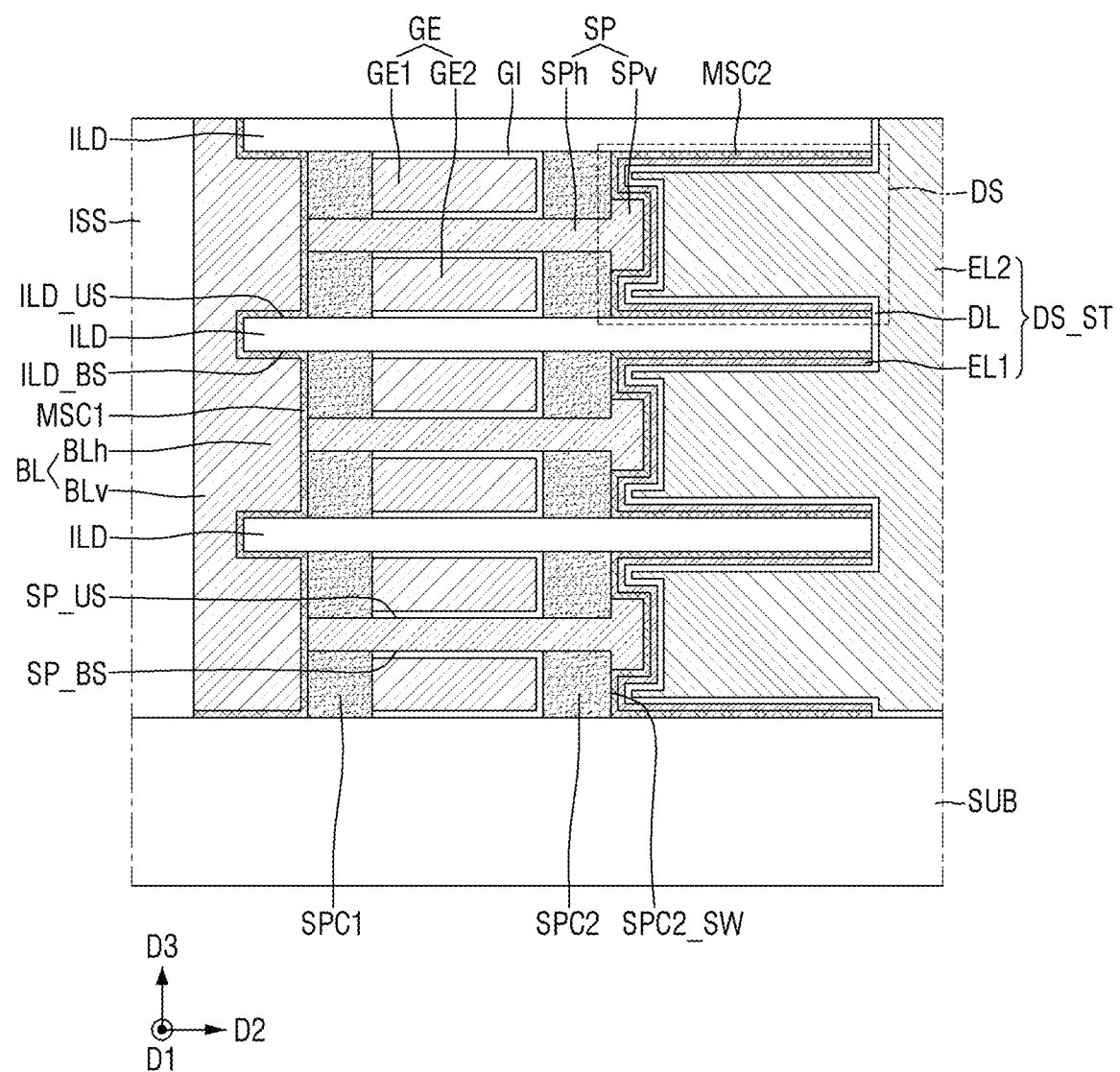
FIG. 17 is a diagram illustrating a semiconductor memory device according to at least one example embodiment.

FIG. 17 is a diagram illustrating a semiconductor memory device according to some example embodiments. For simplicity of description, the following description will focus on the differences between FIG. 17 and FIGS. 8 to 12.

Referring to FIG. 17, in the semiconductor memory device according to some example embodiments, the bit line BL may include a line pattern BLv extending in a third direction D3 and a protrusion pattern BLh extending in the second direction D2.

The protrusion pattern BLh of the bit line may protrude in the second direction D2 from the line pattern BLv of the bit line, but is not limited thereto.

The protrusion pattern BLh of the bit line may be interposed between the mold insulating layers ILD adjacent in the third direction D3, but is not limited thereto.

The first silicide pattern MSC1 may include a portion extending along the top surface ILD_US of the mold insulating layer and the bottom surface ILD_BS of the mold insulating layer, but is not limited thereto.

Figure 18:
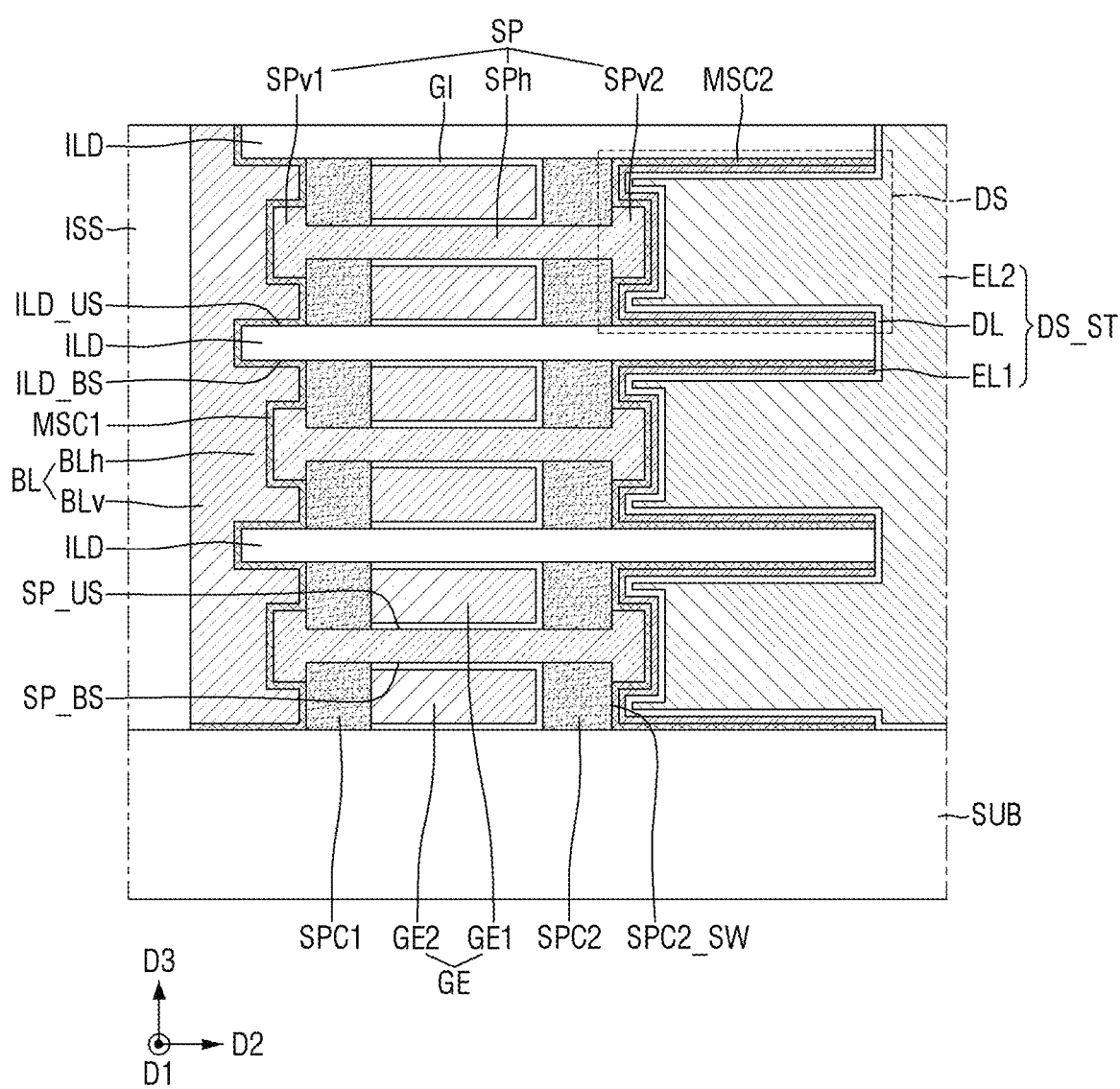
FIG. 18 is a diagram illustrating a semiconductor memory device according to at least one example embodiment.

FIG. 18 is a diagram illustrating a semiconductor memory device according to some example embodiments. For simplicity of description, the following description will focus on the differences between FIG. 18 and FIGS. 8 to 12 and 17.

Referring to FIG. 18, in the semiconductor memory device according to some example embodiments, each semiconductor pattern SP may include the horizontal portion SPh, a first vertical portion SPv1, and a second vertical portion SPv2.

Each of the first vertical portion SPv1 of the semiconductor pattern and the second vertical portion SPv2 of the semiconductor pattern may extend in the third direction D3, but is not limited thereto. The first vertical portion SPv1 of the semiconductor pattern and the second vertical portion SPv2 of the semiconductor pattern are directly connected to the horizontal portion SPh of the semiconductor pattern, but is not limited thereto.

The first vertical portion SPv1 of the semiconductor pattern is connected to the bit line BL. The second vertical portion SPv2 of the semiconductor pattern is connected to the information storage element DS.

The thickness of the horizontal portion SPh of the semiconductor pattern in the third direction D3 may be smaller than the thickness of the first vertical portion SPv1 of the semiconductor pattern in the third direction D3, but is not limited thereto. The thickness of the horizontal portion SPh of the semiconductor pattern in the third direction D3 may be smaller than the thickness of the second vertical portion SPv2 of the semiconductor pattern in the third direction D3, but is not limited thereto. Additionally, because the thickness of the horizontal portion SPh of the semiconductor pattern is smaller than the thickness of the vertical portion SPv of the semiconductor pattern, the 3D semiconductor memory device may have improved electrical characteristics and/or reliability due to an increase of the contact area between the semiconductor pattern and the silicide pattern, thereby creating a low-resistance ohmic contact.

The thickness of the first vertical portion SPv1 of the semiconductor pattern in the third direction D3 may be less than or equal to the height by which the mold insulating layers ILD adjacent to the third direction D3 are spaced apart. The thickness of the second vertical portion SPv2 of the semiconductor pattern in the third direction D3 may be less than or equal to the height by which the mold insulating layers ILD adjacent to the third direction D3 are spaced apart, but is not limited thereto.

Figure 19:
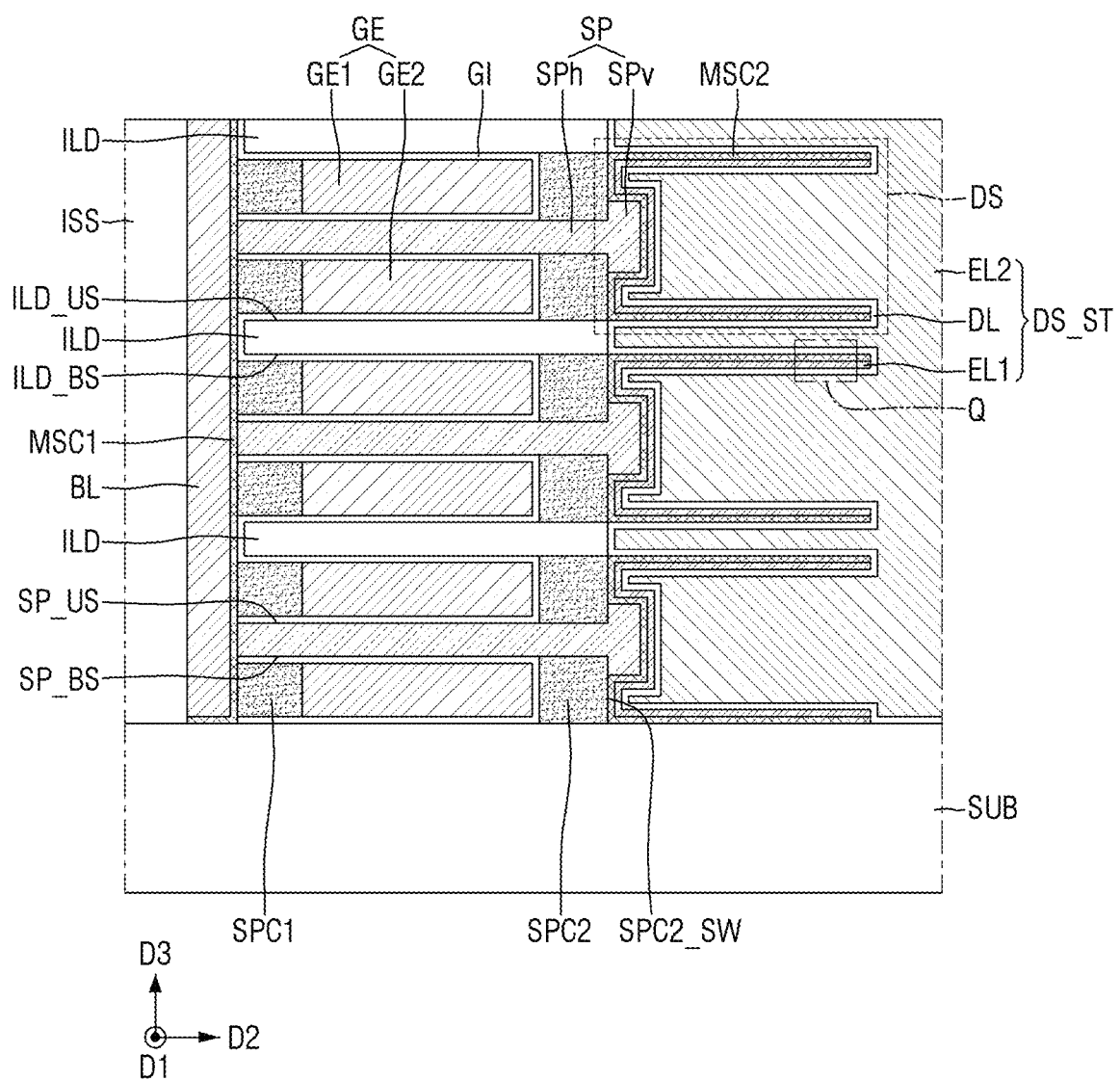
FIG. 19 is a diagram illustrating a semiconductor memory device according to at least one example embodiment.
Figure 20:
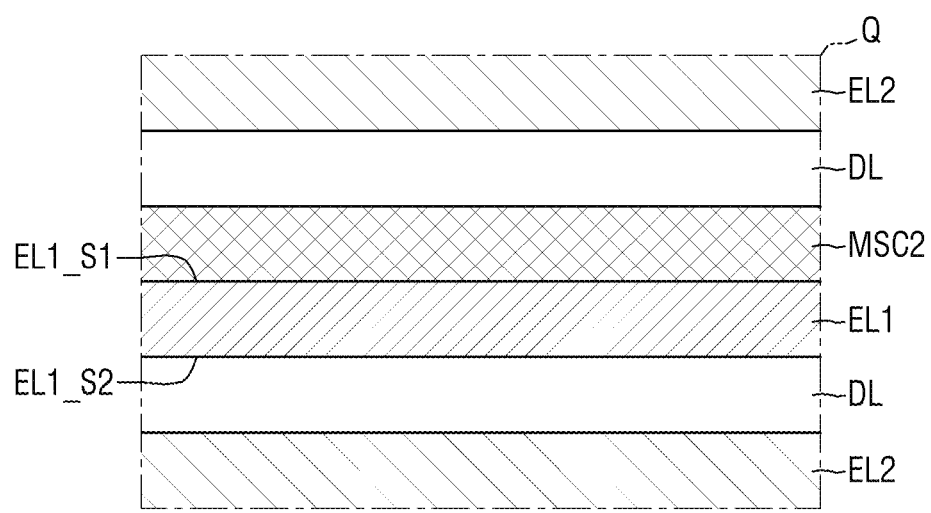
FIG. 20 is an enlarged view of portion Q of FIG. 19 according to at least one example embodiment.

FIG. 19 is a diagram illustrating a semiconductor memory device according to at least one example embodiment. FIG. 20 is an enlarged view of portion Q of FIG. 19 according to some example embodiments. For simplicity of description, the following description will focus on the differences between FIGS. 19 and 20 and FIGS. 8 to 12.

Referring to FIGS. 19 and 20, in the semiconductor memory device according to some example embodiments, each lower electrode EL1 may include an outer wall EL1_S1 and an inner wall EL1_S2, but is not limited thereto.

The outer wall EL1_S1 of the lower electrode may contact the second silicide pattern MSC2. In addition, the lower electrode EL1 may be connected to the vertical portion SPv of the semiconductor pattern through the outer wall EL1_S1 of the lower electrode, but is not limited thereto.

The capacitor dielectric layer DL may extend along the outer wall EL1_S1 of the lower electrode and the inner wall EL1_S2 of the lower electrode, but is not limited thereto. On the other hand, in FIG. 8, since the outer wall of the lower electrode EL1 is covered by the mold insulating layer ILD, the capacitor dielectric layer DL does not extend along the outer wall of the lower electrode EL1.

Figure 21:
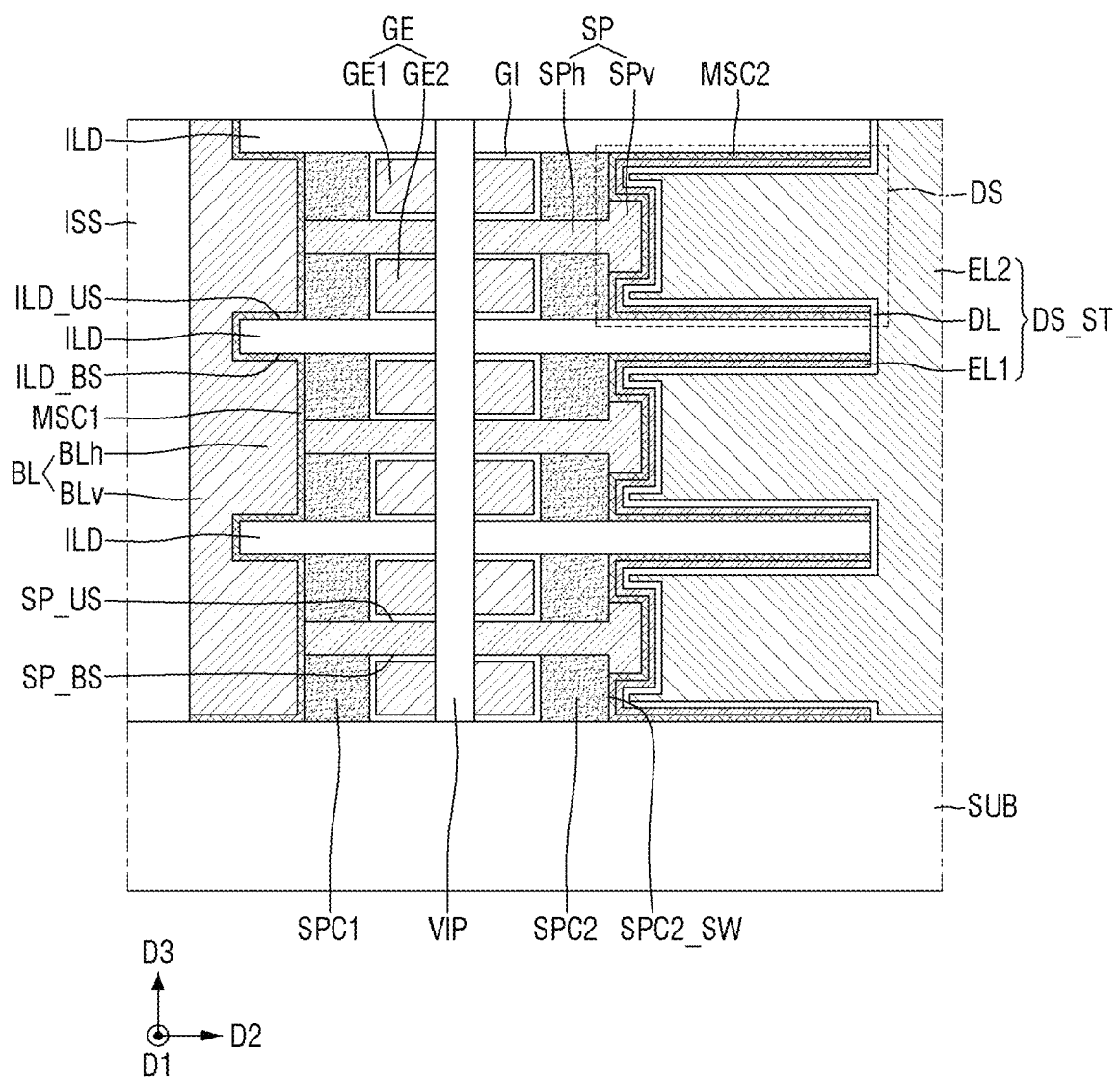
FIG. 21 is a diagram illustrating a semiconductor memory device according to at least one example embodiment.
Figure 22:
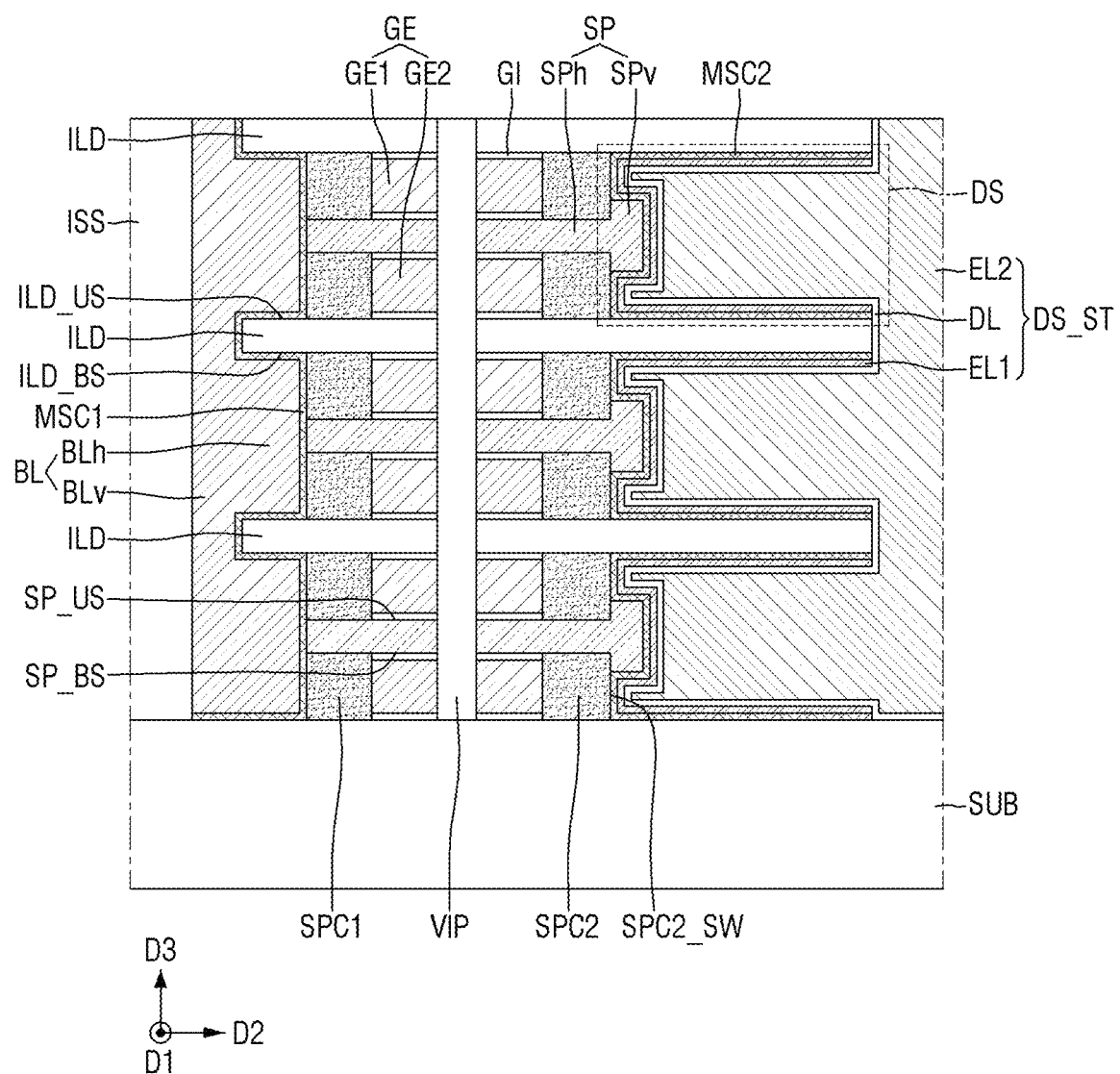
FIG. 22 is a diagram illustrating a semiconductor memory device according to at least one example embodiment.

FIG. 21 is a diagram illustrating a semiconductor memory device according to at least one example embodiment. FIG. 22 is a diagram illustrating a semiconductor memory device according to some example embodiments. For simplicity of description, the following description will focus on the differences between FIGS. 21 and 22 and FIGS. 8 to 12 and 17.

For reference, FIGS. 21 and 22 may be example cross-sectional views of a portion of the semiconductor patterns SP stacked in the third direction D3 in FIG. 5, taken along the second direction D2.

Referring to FIGS. 21 and 22, the semiconductor memory device according to some example embodiments may include a vertical insulating pattern VIP penetrating the semiconductor pattern SP.

Each semiconductor pattern SP may be located along the periphery of the vertical insulating pattern VIP. The vertical insulating pattern VIP may include an insulating material.

In FIG. 21, the gate insulating layer GI may be between the first gate electrode GE1 and the first spacer pattern SPC1, and between the first gate electrode GE1 and the second spacer pattern SPC2, but the example embodiments are not limited thereto.

The gate insulating layer GI may be between the second gate electrode GE2 and the first spacer pattern SPC1, and between the first gate electrode GE2 and the second spacer pattern SPC2, but the example embodiments are not limited thereto.

In FIG. 22, the gate insulating layer GI is not between the first gate electrode GE1 and the first spacer pattern SPC1, and is not between the first gate electrode GE1 and the second spacer pattern SPC2.

According to some example embodiments, the gate insulating layer GI is not between the second gate electrode GE2 and the first spacer pattern SPC1, and is not between the first gate electrode GE2 and the second spacer pattern SPC2.

In concluding the detailed description, those of ordinary skill in the art will appreciate that many variations and modifications can be made to the example embodiments without substantially departing from the principles of the inventive concepts. Therefore, the disclosed example embodiments of the inventive concepts are used in a generic and descriptive sense only and not for purposes of limitation.

What is claimed is:

1. A semiconductor memory device comprising:
at least one bit line on a semiconductor substrate, the at least one bit line extending in a first direction perpendicular to a top surface of the semiconductor substrate;
at least one semiconductor pattern including a horizontal portion extending in a second direction parallel to the top surface of the semiconductor substrate and a vertical portion extending in the first direction, a first end of the horizontal portion of the at least one semiconductor pattern being connected to the at least one bit line, and a second end of the horizontal portion of the at least one semiconductor pattern being connected to the vertical portion of the at least one semiconductor pattern;
at least one gate electrode on the horizontal portion of the at least one semiconductor pattern and extending in a third direction different from the first direction and the second direction; and
at least one information storage element connected to the vertical portion of the at least one semiconductor pattern,
wherein a thickness of the horizontal portion of the at least one semiconductor pattern in the first direction is smaller than a thickness of the vertical portion of the at least one semiconductor pattern in the first direction, and
wherein the at least one gate electrode does not overlap the vertical portion of the semiconductor pattern in the first direction.

2. The semiconductor memory device of claim 1, wherein the horizontal portion of the at least one semiconductor pattern includes a same material as the vertical portion of the at least one semiconductor pattern.

3. The semiconductor memory device of claim 1, wherein
the horizontal portion of the at least one semiconductor pattern includes a first semiconductor material;
the vertical portion of the at least one semiconductor pattern includes a second semiconductor material; and
a lattice constant of the first semiconductor material is smaller than a lattice constant of the second semiconductor material.

4. The semiconductor memory device of claim 1, further comprising:
a first mold insulating layer and a second mold insulating layer on the semiconductor substrate, the first mold insulating layer and the second mold insulating layer are spaced apart from each other in the first direction,
wherein the at least one semiconductor pattern and the at least one gate electrode are between the first mold insulating layer and the second mold insulating layer.

5. The semiconductor memory device of claim 4, wherein a height by which the first mold insulating layer and the second mold insulating layer are spaced apart is equal to the thickness of the vertical portion of the at least one semiconductor pattern in the first direction.

6. The semiconductor memory device of claim 4, wherein
the first mold insulating layer and the second mold insulating layer protrude in the second direction in relation to the vertical portion of the at least one semiconductor pattern; and
the at least one information storage element is between the first mold insulating layer and the second mold insulating layer.

7. The semiconductor memory device of claim 4, wherein the at least one bit line does not include a portion interposed between the first mold insulating layer and the second mold insulating layer, and the at least one bit line does not extend in the second direction.

8. The semiconductor memory device of claim 1, further comprising:
at least one silicide pattern included along a boundary between the at least one information storage element and the vertical portion of the at least one semiconductor pattern.

9. The semiconductor memory device of claim 1, wherein the at least one gate electrode includes an upper gate electrode on a first surface of the horizontal portion of the semiconductor pattern, and a lower gate electrode on a second surface opposite the first surface of the horizontal portion of the at least one semiconductor pattern.

10. The semiconductor memory device of claim 1, wherein the at least one bit line includes a line pattern extending in the first direction, and a protrusion pattern protruding in the second direction from the line pattern of the at least one bit line.

11. The semiconductor memory device of claim 1, wherein the at least one information storage element includes a lower electrode, a capacitor dielectric layer on the lower electrode, and an upper electrode on the capacitor dielectric layer.

12. A semiconductor memory device comprising:
at least one bit line on a semiconductor substrate, the at least one bit line extending in a first direction perpendicular to a top surface of the semiconductor substrate;
at least one gate electrode including an upper gate electrode and a lower gate electrode extending in a second direction parallel to the top surface of the semiconductor substrate, the upper gate electrode being spaced apart from the lower gate electrode in the first direction;

at least one semiconductor pattern having a first portion and a second portion, the at least one semiconductor pattern between the lower gate electrode and the upper gate electrode and extending in a third direction different from the first direction and the second direction, the first portion of the at least one semiconductor pattern having a first thickness in the first direction and overlapping the upper gate electrode and the lower gate electrode in the first direction and the second portion of the at least one semiconductor pattern having a second thickness greater than the first thickness and does not overlap the upper gate electrode and the lower gate electrode in the first direction; and at least one information storage element connected to the at least one semiconductor pattern.

13. The semiconductor memory device of claim 12, wherein the at least one semiconductor pattern has a T shape.

14. The semiconductor memory device of claim 12, further comprising:

a first mold insulating layer and a second mold insulating layer on the semiconductor substrate, the first mold insulating layer and the second mold insulating layer being spaced apart in the first direction, wherein the at least one semiconductor pattern, the lower gate electrode, and the upper gate electrode are arranged between the first mold insulating layer and the second mold insulating layer.

15. The semiconductor memory device of claim 14, wherein the at least one semiconductor pattern is in contact with the first mold insulating layer and the second mold insulating layer.

16. The semiconductor memory device of claim 14, further comprising:

at least one silicide pattern located along a boundary between the at least one information storage element and a vertical portion of the at least one semiconductor pattern, wherein the at least one silicide pattern includes a portion extending in the third direction along the first mold insulating layer and the second mold insulating layer.

17. A semiconductor memory device comprising:

a plurality of mold insulating layers on a semiconductor substrate which are spaced apart from each other in a first direction perpendicular to a top surface of the semiconductor substrate;

a plurality of semiconductor patterns between the plurality of mold insulating layers, the plurality of semiconductor patterns adjacent to each other in the first direction;

a plurality of gate electrodes on each of the plurality of semiconductor patterns, the plurality of gate electrodes between the plurality of mold insulating layers, the plurality of gate electrodes adjacent to each other in the first direction and extending in a second direction perpendicular to the first direction, each of the gate electrodes including an upper gate electrode and a lower gate electrode spaced apart in the first direction;

a bit line on the semiconductor substrate, the bit line extending in the first direction and being connected to the plurality of semiconductor patterns; and a capacitor structure connected to the plurality of semiconductor patterns, wherein each of the semiconductor patterns includes a horizontal portion extending in a third direction different from the first direction and the second direction, and a vertical portion extending in the first direction, a first end of the horizontal portion of each of the semiconductor patterns is connected to the bit line, and a second end of the horizontal portion of each of the semiconductor patterns is connected to the vertical portion of the semiconductor pattern, a thickness of the horizontal portion of each of the semiconductor patterns in the first direction is smaller than a thickness of the vertical portion of each of the semiconductor patterns in the first direction, and the vertical portion of each of the semiconductor patterns does not overlap with the upper and lower gate electrodes in the first direction.

18. The semiconductor memory device of claim 17, wherein the thickness of the vertical portion of each of the semiconductor patterns in the first direction is equal to a height by which the mold insulating layers adjacent in the first direction is spaced apart.

19. The semiconductor memory device of claim 17, wherein the capacitor structure includes:

a plurality of lower electrodes located between the mold insulating layers adjacent in the first direction, each of the plurality of lower electrodes connected to a respective semiconductor pattern of the plurality of semiconductor patterns;

a capacitor dielectric layer extending along a profile of the plurality of lower electrodes; and an upper electrode on the capacitor dielectric layer.

20. The semiconductor memory device of claim 19, further comprising:

a plurality of silicide patterns between each of the lower electrodes and each of the semiconductor patterns, wherein each of the silicide patterns extends along a profile of the respective lower electrode.

* * * * *